United States Patent
Nagasawa et al.

(10) Patent No.: US 11,177,123 B2
(45) Date of Patent: Nov. 16, 2021

(54) COMPOUND SEMICONDUCTOR LAMINATE SUBSTRATE, METHOD FOR MANUFACTURING SAME, AND SEMICONDUCTOR ELEMENT

(71) Applicants: Shin-Etsu Chemical Co., Ltd., Tokyo (JP); CUSIC INC., Sendai (JP)

(72) Inventors: Hiroyuki Nagasawa, Sendai (JP); Yoshihiro Kubota, Annaka (JP); Shoji Akiyama, Annaka (JP)

(73) Assignees: SHIN-ETSU CHEMICAL CO., LTD., Tokyo (JP); CUSIC INC., Sendai (JP)

( * ) Notice: Subject to any disclaimer, the term of this patent is extended or adjusted under 35 U.S.C. 154(b) by 0 days.

(21) Appl. No.: 16/484,285

(22) PCT Filed: Feb. 15, 2018

(86) PCT No.: PCT/JP2018/005169
§ 371 (c)(1),
(2) Date: Aug. 7, 2019

(87) PCT Pub. No.: WO2018/151189
PCT Pub. Date: Aug. 23, 2018

(65) Prior Publication Data
US 2020/0006046 A1 Jan. 2, 2020

(30) Foreign Application Priority Data
Feb. 16, 2017 (JP) .............................. JP2017-027069

(51) Int. Cl.
*H01L 21/02* (2006.01)
*H01L 29/04* (2006.01)
(Continued)

(52) U.S. Cl.
CPC ...... *H01L 21/02008* (2013.01); *H01L 29/045* (2013.01); *H01L 29/1608* (2013.01); *H01L 29/2003* (2013.01)

(58) Field of Classification Search
CPC ............. H01L 21/02008; H01L 29/045; H01L 29/1608; H01L 29/2003
(Continued)

(56) References Cited

U.S. PATENT DOCUMENTS

| 5,011,549 A | 4/1991 | Kong et al. |
| 5,958,132 A * | 9/1999 | Takahashi ............... C30B 23/00 117/84 |

(Continued)

FOREIGN PATENT DOCUMENTS

| JP | 2003-119097 A | 4/2003 |
| JP | 3576432 B2 | 10/2004 |

(Continued)

OTHER PUBLICATIONS

Nagasawa et al. ("Reducing Planar Defects in 3C—SiC"; Chem. Vap. Deposition 2006, 12, 502-508). (Year: 2006).*

(Continued)

*Primary Examiner* — Dzung Tran
(74) *Attorney, Agent, or Firm* — Westerman, Hattori, Daniels & Adrian, LLP

(57) ABSTRACT

A compound semiconductor laminate substrate comprising two single-crystalline compound semiconductor substrates directly bonded together and laminated, the single-crystalline compound semiconductor substrates having the same composition including A and B as constituent elements and having the same atomic arrangement, characterized in that the front and back surfaces of the laminate substrate are polar faces comprising the same kind of atoms of A or B, and that a laminate interface comprises a bond of atoms of either
(Continued)

B or A and is a unipolar anti-phase region boundary plane in which the crystal lattices of the atoms are matched. In this way, the polar faces of the front and rear surfaces of the compound semiconductor laminate substrate are made monopolar, thereby facilitating semiconductor element process designing, and making it possible to manufacture a low-cost, high-performance, and stable semiconductor element without implementing complex substrate processing.

16 Claims, 6 Drawing Sheets

(51) Int. Cl.
    *H01L 29/16*     (2006.01)
    *H01L 29/20*     (2006.01)
(58) Field of Classification Search
    USPC .......................................................... 257/77
    See application file for complete search history.

(56) References Cited

U.S. PATENT DOCUMENTS

| | | | | |
|---|---|---|---|---|
| 6,097,039 | A * | 8/2000 | Peters | H01L 29/045 257/77 |
| 2003/0070611 | A1* | 4/2003 | Nakamura | C30B 25/00 117/109 |
| 2009/0072243 | A1* | 3/2009 | Suda | H01L 29/7787 |
| 2011/0006310 | A1* | 1/2011 | Nagasawa | H01L 29/66068 |
| 2011/0089431 | A1* | 4/2011 | Yagi | C30B 25/18 257/77 |
| 2012/0181550 | A1* | 7/2012 | Fujibayashi | H01L 29/2003 257/77 |
| 2014/0091325 | A1 | 4/2014 | Gunjishima et al. | |

FOREIGN PATENT DOCUMENTS

| | | |
|---|---|---|
| JP | 2011-84435 A | 4/2011 |
| JP | 2012-151177 A | 8/2012 |
| JP | 2012-250888 A | 12/2012 |
| JP | 2013-84781 A | 5/2013 |
| WO | 2012/067105 A1 | 5/2012 |

OTHER PUBLICATIONS

International Search Report dated Apr. 10, 2018, issued in counterpart International Application No. PCT/JP2018/005169, with English Translation. (2 pages).

Nagasawa et al., "Controlling Planar Defects in 3C—SiC: Ways to Wake it up as a Practical Semiconductor", Materials Science Forum, (2015), vols. 821-823, pp. 108-114. Cited in Specification. (7 pages).

Hatta et al., "Reliable Method for Eliminating Stacking Faults on 3C—SiC(001)", Materials Science Forum, (2012), vols. 717-720, pp. 173-176. Cited in Specification. (4 pages).

Kawahara et al., "Correlation Between Leakage Current and Stacking Fault Density of p-n Diodes Fabricated on 3C—SiC", Materials Science Forum, (2010), vols. 645-648, pp. 339-342. Cited in Specification. (4 pages).

* cited by examiner

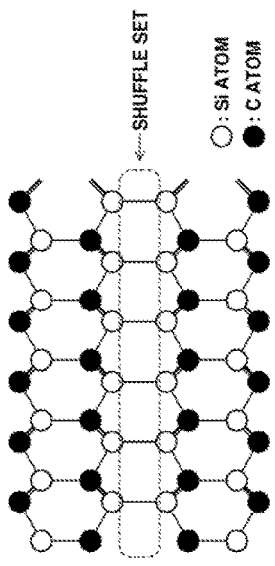
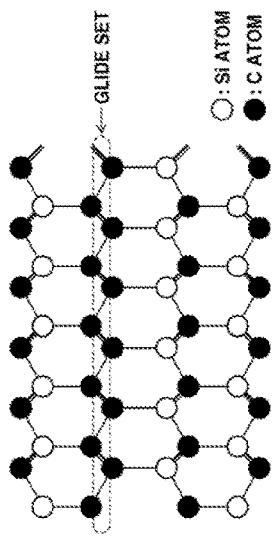
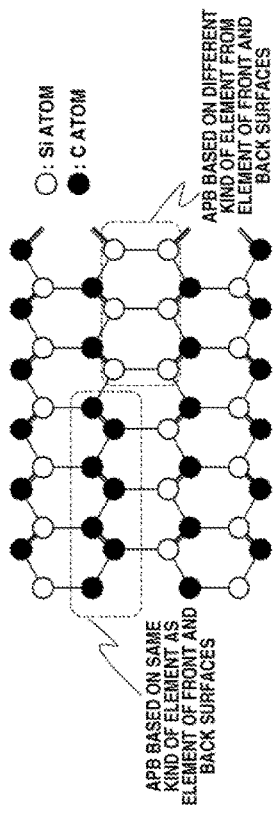

COMPOUND SEMICONDUCTOR LAMINATE SUBSTRATE, METHOD FOR MANUFACTURING SAME, AND SEMICONDUCTOR ELEMENT

TECHNICAL FIELD

The present invention relates to a compound semiconductor laminated substrate that can be favorably used for manufacturing a power semiconductor device, and relates particularly to a compound semiconductor laminated substrate that facilitates the optimization of surface treatment characteristics and process design in a semiconductor device manufacturing process and a method for manufacturing the compound semiconductor laminated substrate, and a semiconductor device.

BACKGROUND ART

Compound semiconductors typified by silicon carbide, gallium nitride, and the like are attracting attention as materials of high performance semiconductor devices those cannot be obtained with silicon, which is commonly used, such as a high-temperature, high-breakdown voltage, low-power consumption semiconductor device or an ultrahigh-rate switching device, owing to their physical, chemical, and electrical characteristics. In practice, significant energy saving characteristics, size reductions, and weight reductions are becoming achieved by compound semiconductors being used as materials of substrates of switching power supplies and motor drives for electric trains, automobiles, etc.

Although compound semiconductors have remarkable advantages as above, they have some usage limitations respect to the element semiconductor like silicon. One limitation is that surfaces of a compound semiconductor crystal have polarities. That is, a single-crystalline compound semiconductor substrate made of constituent elements of A and B inevitably has a polar face (an A polar face, hereinafter also referred to as an A-face) that is made of (terminated with) A atoms and on which dangling bonds of A atoms are exposed and a polar face (a B polar face, hereinafter also referred to as a B-face) that is made of (terminated with) B atoms and on which dangling bonds of B atoms are exposed.

At this time, in the case where the compound semiconductor crystal is a cubic crystal, a hexagonal crystal, or a rhombohedron, a polar face appears on a closest packed plane of the crystal lattice. That is, the closest packed plane of a cubic crystal is the {111} plane; in silicon, all {111} planes are Si polar faces, and are equivalent; in contrast, in a compound semiconductor crystal of a cubic crystal, the (111) plane is a plane on which cation atoms are exposed, and the (-1-1-1) plane on the opposite side to it is a plane on which anion atoms are exposed. Specifically, in cubic crystal silicon carbide (SiC), the (111) plane is a Si-face, and the (-1-1-1) plane, which is a plane on the opposite side to it, is a C-face. On the other hand, the closest packed plane of a compound semiconductor crystal such as a hexagonal crystal or a rhombohedron is the {0001} plane, but the (0001) plane and the (000-1) plane are not equivalent, that is, the former is a plane on which cation atoms are exposed, and the latter is a plane on which anion atoms are exposed. In hexagonal crystal silicon carbide, the (0001) plane is a Si-face, and the (000-1) plane is a C-face. Similarly, in gallium arsenic (GaAs), the (111) plane is a Ga-face, and the (-1-1-1) plane is an As-face; in gallium phosphorus (GaP), the (111) plane is a Ga-face, and the (-1-1-1) plane is a P-face; in gallium nitride (GaN), the (0001) plane is a Ga-face, and the (000-1) plane is a N-face. A main factor that makes it difficult to manufacture a semiconductor device using a compound single-crystal substrate is that physical, chemical, and electrical characteristics are different between polar faces; when it is attempted to optimize the element for a specific polar face, a situation where characteristics on another polar face are impaired occurs many times. Such a difference between the characteristics of polar faces is due to the following two factors: (1) the bond energy between the atom of the outermost surface and the atom one layer below it varies with polarity; and (2) also the surface potential varies in reflection of the difference in ionization tendency between atoms.

A difference between polar faces like the above causes, for example, a problem that the bonding characteristics between a semiconductor and a metal vary, i.e., while one surface exhibits rectification ability, another surface exhibits ohmic characteristics or exhibits a different contact resistance, etc.

Further, also the rate of oxidation is different between polar faces; when thermal oxidation treatment is performed, a large difference may occur in the film thickness of the oxide film between the front surface and the back surface of the substrate. For example, in silicon carbide, the rate of thermal oxidation of the C-face is three times the rate of thermal oxidation of the Si-face; hence, when it is attempted to obtain a thermal oxide film with a desired film thickness on the Si-face, a thermal oxide film with a thickness three times the thickness on the Si-face is formed on the C-face. Thus, it is necessary to perform an extra process such as the process of performing different oxidation treatments for polar faces or the process of etching one oxide film up to a desired film thickness.

Further, also polishing conditions for smoothing the surface are different between polar faces. For example, when obtaining a smooth surface on a silicon carbide substrate, chemical mechanical polishing (CMP) may be performed; the rates of polishing of the C-face and the Si-face vary with the pH of slurry used for CMP treatment. For example, in CMP under alkaline conditions for obtaining a smooth surface for the Si-face, a smooth surface cannot be obtained on the C-face because the C-face is etched more rapidly than the Si-face. Thus, it is necessary that different CMP conditions be used for the Si-face and the C-face, and both planes cannot be polished simultaneously.

A severer problem is that also homoepitaxial growth conditions on a compound semiconductor substrate are influenced by polar faces. When epitaxially growing a compound semiconductor crystal, it is necessary that a plurality of constituent elements be supplied to a surface of a substrate, regardless of a solid phase, a liquid phase, or a gas phase. In this case, the efficiency of element capture is different between polar faces. For example, in the case where it is assumed that a compound semiconductor crystal made of element A and element B is epitaxially grown while the rate of supply is controlled, it is the amount of B atoms supplied that controls the rate of epitaxial growth on an A-face, and it is the amount of A atoms supplied that controls the rate of epitaxial growth on a B-face on the other side. Inevitably, if the amount of A atoms supplied is increased, the rate of epitaxial growth of the B-face is increased, and the rate of epitaxial growth of the A-face is reduced. In addition, also the efficiency of impurity incorporation in polar faces varies. That is, the concentration of an impurity that replaces the lattice site of the A atom decreases as the rate of growth of the B-face increases, and the concentration of an impurity that replaces the lattice site of the B atom decreases as the rate of growth of the A-face increases. As above, in a compound semiconductor crystal, it is difficult for an epitaxial growth film with a desired film thickness and a desired impurity concentration to be simultaneously obtained on all polar faces, and it is necessary that epitaxial growth be performed under conditions peculiar to respective polar faces; thus, problems such as the complication of the process and cost increase arise.

In particular, in the epitaxial growth of silicon carbide, it is necessary that the depositing order of closest packed planes be propagated accurately. To this end, as presented in Patent Document 1 (the specification of U.S. Pat. No. 5,011,549), step flow epitaxy is used in which a surface to be subjected to crystal growth is slightly inclined to a specific direction from a closest packed plane and the depositing order is propagated in the lateral direction. However, the optimum small angle of inclination is different between polar faces; hence, like in the cross-sectional view shown by FIG. 7, different small angles of inclination are needed for the Si-face (the A-face) and the C-face (the B-face), and the cross-sectional shape of the substrate becomes a wedge-like shape and the degree of parallelization is impaired; consequently, problems such as the difficulty of a photolithography process during the manufacturing of a semiconductor element arise.

To solve the problem mentioned above, Patent Document 2 (JP-A 2012-151177) discloses a structure of a silicon carbide substrate in which two hexagonal crystal silicon carbide substrates are prepared, (0001) Si-faces of the substrates are bonded together, and thereby both surfaces correspond to the (000-1) C-face, and a method for manufacturing the structure. Thus, both the front and back surfaces of the substrate are made to be the same C-face, and can be made to be surfaces suitable for a semiconductor element; however, when a semiconductor device is actually formed by using this method, there has been a case where operational malfunction occurs.

PRIOR ART DOCUMENTS

Patent Documents

Patent Document 1: U.S. Pat. No. 5,011,549
Patent Document 2: JP-A 2012-151177
Patent Document 3: JP 3576432
Patent Document 4: WO 2012/067105
Patent Document 5: JP-A 2011-84435
Patent Document 6: JP-A 2003-119097
Non-Patent Document 1: H. Nagasawa, R. Gurunathan, and M. Suemitsu, Materials Science Forum Vols. 821-823 (2015), 108-114
Non-Patent Document 2: Naoki Hatta, Takamitsu Kawahara, Kuniaki Yagi, Hiroyuki Nagasawa, Sergey Reshanov, and Adolf Schoner, Materials Science Forum Vols. 717-720 (2012), pp. 173-176
Non-Patent Document 3: T. Kawahara, N. Natta, K. Yagi, H. Uchida, M. Kobayashi, M. Abe, H. Nagasawa, B. Zippelius, and G. Pensl, Materials Science Forum Vols. 645-648 (2010), pp. 339-342

SUMMARY OF INVENTION

Technical Problem

The present invention has been made in view of the circumstances mentioned above, and an object of the present invention is to provide a compound semiconductor laminated substrate in which polar faces of the front and back surfaces of a compound semiconductor laminated substrate are caused to have unipolarity (mutually the same polarity) and that facilitates the process design of a semiconductor device and enables the manufacturing of a low-cost, high-performance, stable operation without performing complicated substrate processing and a method for manufacturing the compound semiconductor laminated substrate, and a semiconductor device.

Solution to Problem

The present inventors first investigated the operational malfunction of a semiconductor device found in the invention of Patent Document 2 above; and have found that, in the invention of Patent Document 2, there is a case where an incoherent interface (a boundary at which the crystal lattice is discontinuous) and a grain boundary (a boundary at which two crystal lattices are inclined and are connected together only partly) are formed at the interface at which the substrates of the laminated substrate are bonded together, consequently a crystal defect such as a dislocation occurs from there, and this degrades the operation of the semiconductor element.

That is, as a method for manufacturing a SiC semiconductor substrate, Patent Document 2 states that an off substrate may be used that is a substrate for bonding (an $n^+$-type SiC substrate 11 or 12) of which the crystal orientation of the front or back surface has an off angle with respect to a just plane such as the (0001) Si-face or the (000-1) C-face, and states that the off direction and the off angle may be different between the substrates 11 and 12 at this time (paragraph [0042]). This means that, in Patent Document 2, the crystal orientation of the surface to be bonded is not limited, and the rotation of the crystallographic axis is not taken into consideration, either; these are main factors of the occurrence of a defect as mentioned above. For example, if the orientation of a surface to be bonded is not specified and crystal surfaces having different angles of inclination are bonded together, a tilt angle grain boundary occurs at the bonded interface, as shown in FIG. 8 (the boundary indicated by the dot-dash line); further, if a rotation of a crystallographic axis is not solved (if crystal surfaces in a relationship of rotation with a crystallographic axis as the center are bonded together), a twist grain boundary as shown in FIG. 9 occurs at the bonded interface (in the drawing, the region surrounded by the dotted line).

Further, Patent Document 2 states that an effect is obtained also by interposing an electrically conductive film at the bonded interface; however, it has been found that, since the work functions of an electrically conductive film and silicon carbide are different, a space-charge region occurs in the silicon carbide in the vicinity of the electrically conductive film, and this increases the amount of resistance components; consequently, desired low-loss performance is not obtained.

Meanwhile, in the case where the crystal lattice of an affixed interface (also referred to as a bonded interface) is matched and an inversed phase domain boundary (also referred to as an anti-phase boundary (APB); details are described later) is formed, the cross-sectional structure of the crystal lattice at the interface is any of FIGS. 10, 11, and 12.

Among them, in FIG. 10, an APB exists in a shuffle set of the crystal lattice; the APB is formed of an element different from the element exposed on the front or back surface. On the other hand, in FIG. 11, an APB exists in a glide set of the crystal lattice; the APB is formed of the same element as the element exposed on the front and back surfaces. In both structures, the APB is formed of a single element, and is therefore referred to as a unipolar APB.

However, in Patent Document 2, the plane orientations of both surfaces to be bonded together do not coincide strictly, and furthermore the surface roughness Ra (the arithmetic average roughness) of the surface is permitted up to 5 nm; hence, even if an APB occurs by chance at the bonded interface, its interface structure is a bonded interface in which an APB of the type shown in FIG. 10 and an APB of the type shown in FIG. 11 coexist (that is, an antiphase boundary is separated into a glide-set and a shuffle-set). As a result, a bipolar APB as shown in FIG. 12 is formed. In this case, the bipolar APB makes a semi-metallic electrical behavior for a reason described later; therefore, in a power semiconductor device, leakage current is increased, and low-loss performance is impaired.

That is, in order to equalize the front and back polar faces of a substrate and use the substrate as a material of a power semiconductor device, it is necessary that the crystal lattice of the bonded surface continues (a matched interface) and furthermore the formed APB be unipolar (that is, be formed only of bonds of atoms of one specific element; the type of either one of FIGS. 10 and 11).

Here, crystal defects in a compound semiconductor crystal can be a major degradation factor when manufacturing a high-performance semiconductor device. Unlike in silicon, a large number of defects are included in a compound semiconductor crystal, and they influence the operation of the semiconductor device. For example, a dislocation, which is a linear defect, propagates along a specific crystal orientation in the crystal, and impairs the blocking characteristics of the semiconductor device. Further, the locus of a dislocation remains as a stacking fault, and this inhibits the carrier transports in the crystal and behaves as a leakage path. Further, a dislocation moves also due to external stress, an electric field, or energy at the time of carrier recombination, and destabilizes the long-term operating characteristics of the semiconductor device.

Thus far, a large number of inventions have been made for measures against dislocations and stacking faults. For example, Patent Document 3 (JP 3576432) provides a means in which undulations that are substantially parallel to a specific direction of a surface of a silicon substrate on which silicon carbide is to be epitaxially grown are provided, a specific polar face is oriented in the specific direction, and thereby solution to antiphase boundaries, stacking faults, etc. is derived. However, problems such as the following have been remained: processing needs to be performed on the silicon substrate prior to the epitaxial growth of silicon carbide; the motion of dislocations due to external stress cannot be suppressed; and stacking faults occurring due to the motion of mobile dislocations cannot be completely solved.

In order to completely suppress the motion of dislocations and significantly reduce the density of stacking faults, Patent Document 4 (WO 2012/067105) discloses a means in which an inclusive region is provided in the interior of a crystal and the propagation of dislocations is blocked by the inclusive region. In this invention, the densities of dislocations and stacking faults can be drastically reduced; however, the process of forming an inclusive region in the interior of a crystal is complicated, and the inclusive region increases the electric resistance; consequently, it has been difficult to manufacture a high-efficiency semiconductor device at low cost.

Non-Patent Document 1 (H. Nagasawa, R. Gurunathan, and M. Suemitsu, Materials Science Forum Vols. 821-823 (2015), 108-114) has found out that, without taking the trouble to use an inclusive region, an antiphase boundary completely obstructs the motion of dislocations. Hence, dislocations and stacking faults can be solved when an antiphase boundary is intentionally created in the interior of the crystal. Thus, Patent Document 5 (JP-A 2011-84435) has progressed the means disclosed by Patent Document 3, and discloses a means in which discrete undulations are provided on a surface of a substrate on which silicon carbide is to be grown and an antiphase boundary is created, and thereby the expansion of stacking faults is obstructed.

However, the method of Patent Document 5 does not make it possible to control the polarity of an antiphase boundary. The antiphase boundary is a planar defect peculiar to a compound crystal, and is a plane in which a lattice that is supposed to be formed of bonds of different kinds of atoms is formed of bonds of atoms of the same kind of element. When the antiphase boundary is formed of bonds of anions, the energy of conduction band edge is lowered. Conversely, when the antiphase boundary is formed of bonds of cations, the energy of valence band edge is push up. Thus, if both anion-anion bonds and cation-cation bonds are included in the antiphase boundary (if a bipolar APB is formed), electronical properties that are originally supposed to be semiconducting are changed to semi-metallic electronical properties, and the blocking characteristics of the semiconductor device are greatly degraded. Therefore, in the structure disclosed by Patent Document 5, although the amount of stacking faults can be reduced, a remaining antiphase boundary is a semi-metal, and it is difficult to obtain a practical semiconductor device. Further, like in Patent Document 3, the number of additional processes, such as the provision of undulations on a surface of a substrate, is increased, and cost reduction is difficult.

In order to achieve the object mentioned above, the present inventors conducted extensive studies on a means for suppressing the motion of dislocations, while unifying the polarities of the front and back surfaces of a single-crystalline compound semiconductor substrate.

First, attention was paid to the fact that a polar face of a single crystal of a compound semiconductor (also referred to as a compound semiconductor crystal) appears in a closest packed plane and the fact that also a plane of the crystal on the opposite side to the specific polar face is a polar face and has a different polarity. That is, when a compound semiconductor crystal is processed into a flat plate shape in such a manner that closest packed planes are exposed on the front surface and the back surface, the front surface side and the back surface side of the flat plate are different polar faces. This may be considered to be the same as the fact that, when one side of a magnet is the N-pole, the opposite side is inevitably the S-pole.

Here, as in FIG. 1(a), a compound semiconductor single-crystal plate (an original plate 1) with a uniform thickness is envisaged that is a single-crystal substrate of a compound semiconductor containing A and B as constituent elements, and of which one major surface is defined as an A-face that is a polar face $1_{cp1}$ that is made of A atoms (atoms of element A) and on which dangling bonds of A atoms are exposed and another major surface is defined as a B-face that is a polar face $1_{cp2}$ that is made of B atoms and on which dangling bonds of B atoms are exposed. In the case where the original plate 1 is cut horizontally with respect to the front surface, the original plate 1 is separated into two compound semiconductor substrates of substrate 1a and substrate 1b (FIG. 1(b)). Since the front surface of substrate 1a is an A-face, the back surface side (the cut surface) is a B-face. On the other hand, since the back surface of substrate 1b is a B-face, an A-face appears on the front surface side (the cut surface). As a result, when substrate 1a is turned upside down and bonded to substrate 1b, a new substrate (a compound semiconductor laminated substrate 10) having an interface 1ab at which A-faces of both substrates are bonded together is created (FIG. 1(c)). Here, both the front surface and the back surface of the laminated substrate 10 are B-faces; thus, although the created substrate is a substrate of a single-crystalline compound semiconductor, the polar faces exposed on the front and back surfaces of the laminated substrate 10 are unified to unipolarity (mutually the same polarity).

Meanwhile, in the case where the crystal lattices of substrate 1a and substrate 1b are bonded together so as to coincide accurately without inclination or rotation (that is, in a coherent manner), the interface 1ab included in the newly formed laminated substrate 10 is a coherent interface (an interface at which crystal lattices are connected one by one) made of bonds of atoms of the same kind of element (A atom-A atom, or B atom-B atom); thus, unlike the bonded interface of the laminated substrate of Patent Document 2, the interface mentioned above can be regarded as being a unipolar antiphase boundary (a unipolar APB). In this case, as described in Non-Patent Document 1, the interface 1ab inhibits the motion of dislocations; hence, the density of dislocations and the density of stacking faults included in the laminated substrate 10 can be reduced like in the invention disclosed in Patent Document 5, and furthermore the long-term reliability of the operating characteristics of a semiconductor device using this interface is enhanced. Further, unlike in Patent Document 5, the antiphase boundary is either one of anion-anion bonds and cation-cation bonds, and therefore does not make a semi-metallic behavior; thus, the degradation effect in which the blocking characteristics of the semiconductor device are greatly impaired is solved. Further, the interface 1ab is not exposed on a surface; hence, when manufacturing a metal-oxide-semiconductor field effect transistor (MOSFET) or a Schottky barrier diode (SBD) in which an active area is formed in the vicinity of a surface, the antiphase boundary that is the interface 1ab has no influence.

The present inventors further conducted studies on the basis of the findings obtained as above, and have completed the present invention.

In other words, the present invention provides a compound semiconductor laminated substrate and a method for manufacturing same, and a semiconductor device described below.

[1] A compound semiconductor laminated substrate comprising: two single-crystalline compound semiconductor substrates each containing A and B as constituent elements and both having the same composition and the same atomic arrangement, which substrates are directly bonded together and laminated, wherein a front surface and a back surface of the laminated substrate are polar faces made of atoms of the same kind of A or B, and a laminated interface is an unipolar antiphase boundary that is made of bonds of either atoms of B and A to each other and given a coherency in their crystal lattices.

[2] The compound semiconductor laminated substrate according to [1], which is made of silicon carbide, gallium nitride, gallium arsenic, gallium phosphorus, indium phosphorus, aluminum nitride, or indium antimony.

[3] The compound semiconductor laminated substrate according to [1] or [2], wherein each of the laminated compound semiconductor substrates has a uniform thickness.

[4] The compound semiconductor laminated substrate according to any one of [1] to [3], wherein one of the two compound semiconductor substrates is a thin film of a compound semiconductor.

[5] The compound semiconductor laminated substrate according to [4], wherein one of the two compound semiconductor substrates is an epitaxial growth film.

[6] A method for manufacturing a compound semiconductor laminated substrate, comprising: preparing two single-crystalline compound semiconductor substrates in each of which one major surface is an A-face that is a polar face made of A atoms and another major surface is a B-face that is a polar face made of B atoms, each of which contains A and B as constituent elements, and both of which have the same composition and the same atomic arrangement; and directly affixing together the B-faces or the A-faces of the two compound semiconductor substrates in a state where specific crystal planes of both substrates are aligned, and thereby bonding the two compound semiconductor substrates to obtain a compound semiconductor laminated substrate in which a front surface and a back surface of the laminated substrate are polar faces made of atoms of the same kind of A or B and a laminated interface is a unipolar antiphase boundary that is made of bonds of either atoms of B and A to each other and given a coherency in their crystal lattices.

[7] The method for manufacturing a compound semiconductor laminated substrate according to [6], wherein orientation flats or notches each provided to allow identification of a specific crystal plane of the compound semiconductor substrate are set in a prescribed positional relationship between both substrates, and thereby the specific crystal planes are aligned.

[8] The method for manufacturing a compound semiconductor laminated substrate according to [6] or [7], wherein a surface of one compound semiconductor substrate out of the two compound semiconductor substrates, which surface is to be bonded to the other compound semiconductor substrate, is subjected to ion implantation in advance, then the bonding is performed, and then peeling is performed at the ion implantation region to form a thin layer out of the compound semiconductor substrate.

[9] The method for manufacturing a compound semiconductor laminated substrate according to [6] or [7], wherein one compound semiconductor substrate out of the two compound semiconductor substrates is a compound semiconductor substrate in which, on its surface to be bonded to the other compound semiconductor substrate, a homoepitaxial growth layer of the same compound as the one compound semiconductor substrate is formed in advance.

[10] The method for manufacturing a compound semiconductor laminated substrate according to [9], wherein a buffer layer obtained by doping the same compound with an impurity is provided between the one compound semiconductor substrate and the homoepitaxial growth layer.

[11] The method for manufacturing a compound semiconductor laminated substrate according to [9] or [10], wherein the homoepitaxial growth layer is subjected to ion implantation in advance, then the bonding is performed, and then peeling is performed at the ion implantation region and part of the homoepitaxial growth layer is transferred, as formation of a thin layer out of the compound semiconductor substrate.

[12] The method for manufacturing a compound semiconductor laminated substrate according to any one of [6] to [11], wherein the two compound semiconductor substrates are obtained from the same single-crystalline compound semiconductor substrate.

[13] The method for manufacturing a compound semiconductor laminated substrate according to any one of [6] to [12], wherein the two compound semiconductor substrates are simultaneously subjected to surface treatment under the same treatment conditions, and surface states of bonded surfaces of both substrates are made equivalent.

[14] The method for manufacturing a compound semiconductor laminated substrate according to any one of [6] to [13], wherein, before the bonding, both bonded surfaces of the two compound semiconductor substrates are subjected to surface activation treatment under the same treatment conditions.

[15] A semiconductor device using the compound semiconductor laminated substrate according to any one of [1] to [5].

Advantageous Effects of Invention

In a compound semiconductor laminated substrate of the present invention, although it is a substrate of a compound semiconductor crystal, the front surface and the back surface have the same polarity; therefore, various physical and chemical properties (oxidation rates, etching rates, polishing rates, etc.) of the front and back coincide strictly, and wafer processing conditions (beveling, cleaning, grinding, polishing, etc.) for the front and back of the substrate coincide; thus, simultaneous treatment of the front and back is possible. In particular, in the manufacturing of a wafer for a discrete semiconductor in which process treatment is performed on the front and back of a wafer, surfaces of the same properties are obtained for both the front and back by the same treatment; thus, the compound semiconductor laminated substrate of the present invention is useful.

Further, the compound semiconductor laminated substrate of the present invention includes, in its interior, a unipolar antiphase boundary as an essential component. The antiphase boundary has a single polarity, and therefore does not take on semi-metallic properties; thus, the blocking characteristics of the semiconductor device are kept. Further, the antiphase boundary inhibits the motion (propagation) of dislocations in the crystal; thus, reductions in the density of dislocations and the density of stacking faults, and the long-term reliability of the semiconductor device are ensured.

BRIEF DESCRIPTION OF DRAWINGS

FIG. 10 is a schematic cross-sectional view showing a structure of a unipolar antiphase boundary n which crystal lattices are matched and that is formed of an element different from the element of the front or back surface.

FIG. 11 is a schematic cross-sectional view showing a structure of a unipolar antiphase boundary in which crystal lattices are matched and that is formed of the same element as the element of the front and back surfaces.

FIG. 12 is a schematic cross-sectional view showing a structure of a bipolar antiphase boundary in which crystal lattices are matched.

DESCRIPTION OF EMBODIMENTS

Hereinbelow, embodiments of the present invention are described.

[Compound Semiconductor Laminated Substrate]

Figure 1A:
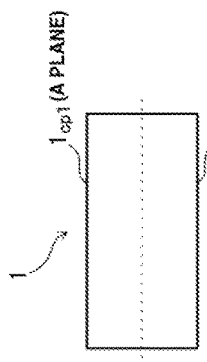
FIGS. 1A-1C are a conceptual diagram showing a configuration and a manufacturing procedure of a compound semiconductor laminated substrate according to the present invention.
Figure 1B:
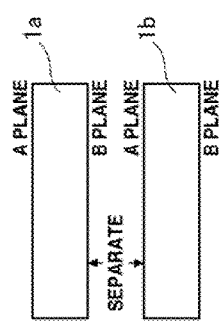
Figure 1C:
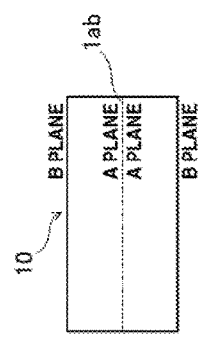
Figure 2:
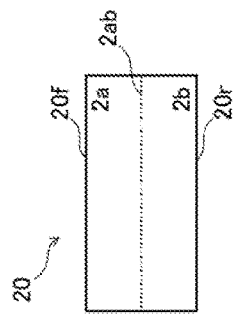
FIG. 2 is a schematic diagram showing a cross-sectional configuration of a compound semiconductor laminated substrate according to the present invention.

FIG. 2 shows a cross-sectional configuration of a compound semiconductor laminated substrate according to the present invention. As shown in FIG. 2, a compound semiconductor laminated substrate 20 is a substrate in which two single-crystalline compound semiconductor substrates 2a and 2b having the same composition and the same atomic arrangement are directly bonded together and are laminated; the front and back surfaces of the laminated substrate 20 are polar faces that are made of atoms of the same kind of element (any one) among a plurality of elements contained in the compound semiconductor substrates 2a and 2b and on which dangling bonds of atoms of the kind mentioned above are exposed; the laminated interface is a unipolar antiphase boundary 2ab that is parallel to the surfaces (the front surface 20f and the back surface 20r) of the laminated substrate 20 and is made of bonds of atoms of the same kind of element of any one of a plurality of elements contained in the compound semiconductor substrates 2a and 2b and at which the crystal lattices of these atoms are matched. Alternatively, the compound semiconductor laminated substrate 20 is a substrate in which two single-crystalline compound semiconductor substrates 2a and 2b having the same composition containing A and B as constituent elements and having the same atomic arrangement are directly bonded together and are laminated; the front and back surfaces of the laminated substrate 20 are polar faces that are made of atoms of the same kind (either one) of A or B and on which dangling bonds of atoms of the kind mentioned above are exposed; the laminated interface is a unipolar antiphase boundary 2ab that is parallel to the surfaces (the front surface 20f and the back surface 20r) of the laminated substrate 20 and is made of bonds of either atoms of B and A to each other, and at which the crystal lattices of these atoms are matched.

The description of "the front and back surfaces of the laminated substrate 20 are polar faces that are made of atoms of the same kind (either one) of A or B and on which dangling bonds of atoms of the kind mentioned above are exposed" means that both the front and back surfaces of the laminated substrate 20 have become closest packed planes (A-faces) of A atoms in the crystal lattice of the compound semiconductor crystal or both have become closest packed planes (B-faces) of B atoms.

This means, in other words, that both the front and back surfaces of the laminated substrate 20 have become crystal planes of the same plane indices (Miller indices). For example, in the case where the laminated substrate 20 is made of silicon carbide (SiC) of crystal polymorphism 4H-SiC, both the front and back surfaces are (0001) Si-faces, or both are (000-1) C-faces.

Here, the compound semiconductor laminated substrate 20 is made of a compound semiconductor with a composition containing A and B as constituent elements, and is preferably made of a binary compound semiconductor of A and B; for example, is preferably made of silicon carbide, gallium nitride, gallium arsenic, gallium phosphorus, indium phosphorus, aluminum nitride, or indium antimony, more preferably made of silicon carbide, gallium nitride, gallium arsenic, or gallium phosphorus, and particularly preferably made of silicon carbide.

In the case where the compound semiconductor laminated substrate 20 is made of silicon carbide (SiC), the compound semiconductor laminated substrate 20 is a substrate in which compound semiconductor substrates 2a and 2b made of single-crystal SiC having the same atomic arrangement are laminated; the front and back surfaces 20f and 20r of the laminated substrate 20 are polar faces that are terminated with Si atoms (or C atoms) (that is, made of Si atoms (or C atoms)) out of Si and C contained in the compound semiconductor substrates 2a and 2b, on which dangling bonds of atoms of the kind mentioned above are exposed, and that have mutually the same polarity; the laminated interface is a unipolar anti phase boundary (a unipolar APB) 2ab that is parallel to the surfaces (the front surface 20f and the back surface 20r) of the laminated substrate 20 and at which atoms (that is, C atoms or Si atoms) of the same kind of element of either one of Si and C contained in the compound semiconductor substrates 2a and 2b are bonded together (C—C bonds or Si—Si bonds) and the crystal lattices of these atoms are matched. The unipolar APB 2ab is the bonded interface of either of FIGS. 10 and 11.

The description of "the crystal lattices are coherent" refers to a state where the crystal lattice of the compound semiconductor substrate 2a side and the crystal lattice of the compound semiconductor substrate 2b side are continuously connected together at the entire laminated interface (coherency in their crystal lattices). At this time, the crystal orientation of the substrate 2a side and the crystal orientation of the substrate 2b side are aligned. In this case, a state where the crystal lattices are completely connected together is most preferable, but a state where the crystal lattices fail to be connected together to some degree is permitted.

Here, the degree to which the crystal lattices fail to be connected together (the density of incoherent interfaces) is expressed by the ratio per unit area of the number of atoms that fail to be bonded together at the laminated interface, and is specifically expressed by (the number of atom pairs not bonded together)/(the total number of atom pairs supposed to be bonded together) at the laminated interface per unit area×100(%), which is preferably less than or equal to 0.1% of the density of atoms constituting the interface, and more preferably less than or equal to 0.02%. This ratio can be measured by using electron spin resonance.

If an incoherent interface exists at the laminated interface, the incoherent interface captures carriers those serve for electrical conduction in the semiconductor device, and consequently ionizes. As a result, the low-loss performance of the semiconductor device is impaired. To avoid the occurrence of this problem, the density of traps at the interface is preferably set to less than or equal to $10^9/cm^2$, and each of the tolerance angle and the rotation angle between the laminated crystal lattices is preferably set to less than or equal to 50 arcsec, and more preferably set to less than or equal to 20 arcsec.

To obtain the antiphase boundary 2ab mentioned above, the manufacturing method needs to be modified, as described later; a simple process of bonding together A-faces or B-faces of the substrates 2a and 2b alone does not makes it possible to obtain the antiphase boundary 2ab.

The crystal polymorphisms of the single-crystalline compound semiconductors that form the compound semiconductor substrates 2a and 2b are not particularly limited as long as they are the same, that is, the crystal systems are the same and the manners of arrangement of atoms in the crystals are the same. For example, in the case of silicon carbide (SiC), any of 4H-SiC, 6H-SiC, 3C-SiC, and the like is possible as long as the crystal polymorphisms are the same. However, the surfaces of the substrates (2a and 2b) to be bonded together are preferably in exactly the same state. This is because, if the surface states are different, a bipolar APB occurs like in FIG. 12. Thus, it is preferable that the substrates 2a and 2b be simultaneously surface-treated under the same conditions before the bonding of the substrates.

The thickness of the compound semiconductor laminated substrate 20 is not particularly limited; for example, it is preferably 100 to 800 μm, and more preferably 200 to 500 μm. The compound semiconductor laminated substrate 20 preferably has a uniform thickness (that is, the front surface 20f and the back surface 20r are preferably parallel).

The thickness of each of the laminated compound semiconductor substrates 2a and 2b is not particularly limited, either. The compound semiconductor substrates 2a and 2b do not need to have mutually the same thickness, and each preferably has a uniform thickness. For example, one of the two compound semiconductor substrates 2a and 2b may be a thin film of a compound semiconductor. In this case, the thin film of a compound semiconductor may be a transfer film that has been peeled off from a compound semiconductor substrate serving as an original plate by the ion implantation peeling method. Further, the thin film of a compound semiconductor may be one in which an epitaxial growth film has been transferred. In the case where one of the compound semiconductor substrates 2a and 2b is a thin film of a compound semiconductor, the other substrate serves as a support substrate of the thin film.

The thickness of each of the compound semiconductor substrates 2a and 2b may be selected preferably in the range of 100 nm to 1,000 μm, and more preferably in the range of 200 nm to 650 μm, for example.

In the laminated substrate 20 of the present invention, both the front and back surfaces are crystal planes with the same plane indices; thereby, various physical and chemical properties (oxidation rates, etching rates, polishing rates, etc.) of the front and back surfaces coincide strictly, and wafer processing conditions (beveling, cleaning, grinding, polishing, etc.) for the front and back surfaces of the substrate coincide; thus, simultaneous treatment of the front and back surfaces is possible. In particular, in the manufacturing of a wafer for a discrete semiconductor in which process treatment is performed on the front and back of a wafer, surfaces of the same nature are obtained for both the front and back surfaces by the same treatment; thus, the laminated substrate 20 of the present invention is useful. In addition, also in the manufacturing of a semiconductor device, the front and back surfaces of a compound semiconductor laminated substrate can be processed simultaneously under the same process conditions as optimum process conditions, and cost reduction is promoted. Further, in the case where it is attempted to obtain a high-quality homoepitaxial growth layer on a compound crystal, a surface having a specific small inclination with respect to a crystal plane is used as a substrate intentionally; in this case, when a substrate according to the present invention is used, since both the front and back are crystal planes of the same nature, also the optimum small angle of inclination coincides completely between the front and back, and the degree of parallelization between the front and back is not impaired; thus, a wafer with a high degree of parallelization suitable for element manufacturing can be obtained. In particular, since epitaxial growth can be made on the back surface side of a compound semiconductor laminated substrate under similar conditions to the front surface, a p-type layer serving as a collector layer of an insulated gate bipolar transistor (IGBT) can be formed on the back surface side by epitaxial growth, and the flexibility of the semiconductor device manufacturing process is increased.

Further, the laminated interface of the laminated substrate 20 is a unipolar antiphase boundary 2ab, and therefore does not take on semi-metallic properties; thus, the blocking characteristics of the semiconductor device are kept. Further, the antiphase boundary 2ab inhibits the motion (propagation) of dislocations in the crystal; thus, reductions in the density of dislocations and the density of stacking faults, and the long-term reliability of the semiconductor device are ensured. The blocking characteristics of a semiconductor device are the characteristics of preventing (or hindering) a current from flowing between main electrodes of a semiconductor device even when a high potential difference is applied between the main electrodes in a specific direction.

This effect is similarly exhibited in compound semiconductor crystals having polarity, such as silicon carbide, gallium nitride, gallium arsenic, gallium phosphorus, indium phosphorus, aluminum nitride, and indium antimony.

[Method for Manufacturing Compound Semiconductor Laminated Substrate]

First, second, and third embodiments of the method for manufacturing a compound semiconductor laminated substrate of the present invention described above are described.

First Embodiment

A first embodiment of the method for manufacturing a compound semiconductor laminated substrate according to the present invention is described using FIG. 3.

Figure 3A:
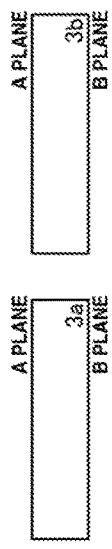
FIGS. 3A-3C are a diagram showing a manufacturing process in a first embodiment of a method for manufacturing a compound semiconductor laminated substrate according to the present invention.

First, two single-crystalline compound semiconductor substrates 3a and 3b in each of which closest packed planes are orientated in the front surface and the back surface of the substrate (set as the front and back surfaces of the substrate) are prepared (FIG. 3(a)).

At this time, it is necessary that the constituent elements and the constituent element ratios of the substrates 3a and 3b be set the same (that is, be set to the same composition). The crystal systems of the substrates 3a and 3b may be arbitrarily selected from combinations of a triclinic crystal, a monoclinic crystal, an orthorhombic crystal, a tetragonal crystal, a trigonal crystal, a cubic crystal, a hexagonal crystal, and a rhombohedron as long as both are the same crystal system; but the atomic arrangements in the substrates 3a and 3b need to be the same. For example, in the case where the substrates 3a and 3b are made of silicon carbide, both substrates 3a and 3b are 4H-SiC, both are 6H-SiC, or both are 3C-SiC.

In the case where, for example, the crystal system is a cubic crystal, the closest packed plane is the {111} plane; in the case of a hexagonal crystal or a rhombohedron, the closest packed plane is the {0001} plane.

In the case where the compound semiconductor substrates 3a and 3b have the same composition containing A and B as constituent elements and the same atomic arrangement, the front surface of each of the substrates 3a and 3b is a polar face that is made of atoms of the same kind of element and on which dangling bonds of atoms of the kind mentioned above are exposed, and the back surface is a polar face that is made of atoms of the same kind of element different from the element of the front surface and on which dangling bonds of atoms of the kind mentioned above are exposed. Here, of the closest packed planes mentioned above, the polar face that is made of atoms on the cation side and on which dangling bonds of cation atoms are exposed is defined as an A-face, and the plane that is made of atoms on the anion side and on which dangling bonds of anion atoms are exposed is defined as a B-face.

The method for identifying the A-face and the B-face in each of the compound semiconductor substrates 3a and 3b varies with the constituent elements; for example, in the case of silicon carbide, the comparison of the rate of thermal oxidation is given. That is, when the rate of thermal oxidation of the A-face is higher than the rate of thermal oxidation of the B-face, it can be identified that the A-face is a carbon plane and the B-face is a silicon plane. For compound semiconductors with high ionicity (gallium arsenic, gallium phosphorus, indium phosphorus, and the like), the identification can be made also by using a probe microscope to measure the electric potential of the surface. Alternatively, in the case where homoepitaxial growth is performed and the amount of anion atoms supplied is increased, the surface can be determined as an anion-face when the rate of growth is relatively reduced, and conversely can be determined as a cation-face when the rate of growth is relatively increased.

After the A-face and the B-face in each of the compound semiconductor substrates 3a and 3b are identified in the above manner, a mark that allows distinction between the A-face and the B-face is provided to a place of each of the substrates 3a and 3b where the performance of the laminated substrate 30 is not influenced.

Figure 4:
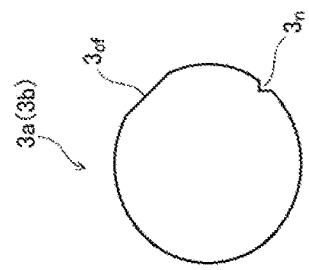
FIG. 4 is a diagram showing an external appearance of a compound semiconductor substrate used in the present invention.

Further, a mark that allows the identification of a crystal plane in a specific orientation (Miller indices) in the surface to be bonded (the A-face or the B-face) of each of the substrates 3a and 3b is provided to each of the substrates 3a and 3b. An orientation flat (also referred to as an OF) or a notch originally provided on a single-crystal wafer may be utilized as the mark. That is, as shown in FIG. 4, a mark is provided to each of the substrates 3a and 3b as an orientation flat $3_{of}$ or a notch $3_n$ in advance so that a specific crystal plane in the A-face or the B-face that is the surface to be bonded of each of the substrates 3a and 3b can be identified. For example, in the case where a compound semiconductor substrate 3a (and 3b) of a 4H-SiC wafer is used, an orientation flat $3_{of}$ drawn along the (11-20) plane of each of the substrates 3a and 3b (of which a flat side (a straight line-shaped side) is parallel to the crystal plane) is provided, and a notch $3_n$ is provided in a position 90° clockwise from the orientation flat $3_{of}$ when the (000-1) C-face, which is the surface to be affixed (the surface to be bonded), is set as the front surface (FIG. 4). Alternatively, in the case where a compound semiconductor substrate 3a (and 3b) of a 3C-SiC wafer is used, an orientation flat $3_{of}$ drawn along the (110) plane of each of the substrates 3a and 3b (of which a flat side is parallel to the crystal plane) is provided, and a notch $3_n$ is provided in a position 90° clockwise from the orientation flat $3_{of}$ when the (111) Si-face, which is the surface to be bonded, is set as the front surface (FIG. 4).

Alternatively, two orientation flats with different lengths may be provided to the substrate so as to be parallel to respective different specific crystal planes. In this case, a longer orientation flat (OF1) is provided in the [11-20] orientation of the crystal plane, and a shorter orientation flat (OF2) is provided parallel to the [1-100] orientation of the crystal plane. Specifically, an orientation flat OF1 is set in a position in the 6 o'clock direction of a clock in each of both two substrates; then, one substrate is provided with an orientation flat OF2 in a position in the 3 o'clock direction of the clock, and the other substrate is provided with an orientation flat OF2 in a position in the 9 o'clock direction of the clock. That is, in both substrates, the orientation flat OF1 and the orientation flat OF2 are in an orthogonal relationship; thus, high-accuracy alignment can be made easily when both orientation flats OF1 and both orientation flats OF2 are aligned by using an L-shaped jig.

At this time, the tolerance between the orientation flat $3_{of}$ of FIG. 4 and the specific crystal orientation is preferably within 50 arcsec, and more preferably within 20 arcsec. Tolerances within the range mentioned above are preferable because, after a bonding process (an affixing process) described later, a matched interface at which crystal lattices are matched is obtained in the bonded portion and a unipolar antiphase boundary of the objective is formed, and the occurrence of the origin of a dislocation such as a twist grain boundary or a tilt angle grain boundary can be suppressed easily.

The compound semiconductor substrates 3a and 3b are preferably made of silicon carbide, gallium nitride, gallium arsenic, gallium phosphorus, indium phosphorus, aluminum nitride, or indium antimony, more preferably made of silicon carbide, gallium nitride, gallium arsenic, or gallium phosphorus, and particularly preferably made of silicon carbide. For example, in the case of being made of silicon carbide, the cation-face is a Si-face and the anion-face is a C-face; in the case of being made of gallium nitride, the cation-face is a Ga-face and the anion-face is a N-face; in the case of being made of gallium arsenic, the cation-face is a Ga-face and the anion-face is an As-face; in the case of being made of gallium phosphorus, the cation-face is a Ga-face and the anion-face is a P-face; in the case of being made of gallium nitride, the cation-face is a Ga-face and the anion-face is a N-face.

Also in view of performing homoepitaxial growth in a later process, the orientation of the closest packed plane (the crystal orientation of the closest packed plane) of each of the front surfaces and the back surfaces of the compound semiconductor substrates 3a and 3b may be slightly inclined to a prescribed direction with respect to the normal line to the substrate. The angle of inclination at this time is set to the optimum value in a desired plane polarity; in the substrates 3a and 3b, the angles of inclination are the same angle of inclination in mirror symmetry directions; when the angles of inclination of the front surface and the back surface are equalized, the degree of parallelization between the surfaces of the compound semiconductor substrate is kept, and the bonded surfaces form a matched interface.

It is preferable to perform surface treatment for making strictly equivalent the surface states of at least the bonded surfaces of the substrates 3a and 3b. Specifically, surface treatments of the substrates 3a and 3b may be performed simultaneously under the same treatment conditions; thereby, both surface states are made strictly equal, and a unipolar antiphase boundary as shown in FIG. 10 or FIG. 11 is obtained; thus, this is to preferable. On the other hand, if nonequivalent surfaces are bonded together, a bipolar APB like FIG. 12 is formed, and the characteristics of the semiconductor device are impaired. The description of "the surface states are equivalent" refers to a state where, for both two substrates, all the terminals of the surfaces are uniformly occupied by atoms of the same element of any of elements contained in the compound semiconductor.

To this end, surface treatment is performed simultaneously on the substrates 3a and 3b as a pair. The optimum surface treatment method depends on the material of the substrate; for example, in the case of a silicon carbide substrate, there is a method in which cleaning is performed with a mixed acid of hydrogen peroxide water and sulfuric acid, then the oxide film of the surface is removed by dilute hydrofluoric acid, and thereby a clean surface is obtained. Further, in order to prescribe the structure of the unipolar APB, heating may be performed in a hydrogen atmosphere to terminate the surface with hydrogen; thereby, the controllability of the surface polarity is enhanced, and an APB in a shuffle-set position as shown in FIG. 10 can be obtained at the bonded interface reliably.

Alternatively, after the hydrogen treatment mentioned above, the temperature is increased to more than or equal to 1,600° C. to form single-layer graphene on the outermost surfaces, further the graphene is oxidized and removed, and the surfaces are bonded together; thereby, an APB in a glide-set position as shown in FIG. 11 can be obtained at the bonded interface.

Figure 3B:
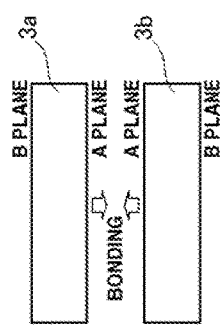

Next, the A-face (or the B-face) of the compound semiconductor substrate 3a and the A-face (or the B-face) of the compound semiconductor substrate 3b are affixed and bonded together such that the A-faces (or the B-faces) are directly in contact in a state where the specific crystal planes of both substrates 3a and 3b are aligned (FIG. 3(b)).

Here, as described above, it is preferable that the specific crystal planes of the substrates 3a and 3b be aligned by using marks provided to allow the identification of the specific crystal planes (that is, the specific crystal orientations be made to completely agree and the continuity of the crystal lattice be maintained even across the laminated interface). For example, the specific crystal planes mentioned above may be aligned (that is, the specific crystal orientation of the substrate 3a and the specific crystal orientation of the substrate 3b may be made to agree) by strictly aligning orientation flats $3_{of}$ provided along certain crystal planes of the substrates 3a and 3b (such that flat sides are parallel to the crystal planes) or cut-like notches $3_n$ provided in directions corresponding to certain crystal planes so as to achieve a prescribed positional relationship between both substrates. Thereby, the atomic arrangements of the substrates 3a and 3b at the bonded surfaces are aligned, and the crystal lattices are matched; thus, an antiphase boundary 3ab is formed.

For example, in substrates 3a and 3b made of hexagonal crystals, the affixing is preferably performed such that the [1-100] orientation of the substrate 3a and the [-1100] orientation of the substrate 3b are made to agree. Further, in substrates 3a and 3b made of cubic crystals, the affixing is preferably performed such that the [110] orientation of the substrate 3a and the [-1-10] orientation of the substrate 3b are made to agree.

At this time, the tolerance between the crystal orientations of the substrate 3a and the substrate 3b (the angle difference between the crystal orientation of the substrate 3a and the crystal orientation of the substrate 3b that should agree) is preferably less than or equal to 50 arcsec, and more preferably less than or equal to 20 arcsec. Thereby, the crystal lattices are matched at the bonded interface, and a unipolar antiphase boundary is formed; thus, the effect of the present invention is exhibited more significantly. Further, the occurrence of dislocations and stacking faults is suppressed in the matched interface of the affixed surfaces (the bonded surfaces), and the density of defects in the compound semiconductor substrate can be reduced.

In the present invention, two substrates provided with marks such as orientation flats corresponding to crystal orientations (that have undergone external shape processing) are prepared, and prescribed crystal planes are affixed and bonded together such that specific crystal orientations between the two substrates are aligned by performing strict alignment by means of both marks; thereby, the laminated interface is made to be a unipolar APB. In this case, it is important that the tolerance in crystal orientation between the stacking surfaces of the bonded two substrates (the deviation in the direction of rotation of the plate surface) be as small as possible.

Thus, in the present invention, as described above, marks such as a plurality of orientation flats in a prescribed positional relationship with respect to a prescribed crystal orientation are provided to the substrate so that the prescribed crystal orientation can be identified; however, usually it is sufficient to provide two marks, namely a first mark and a second mark, and these may have different shapes so as to be mutually distinguishable. For example, in the case of orientation flats, these are made to have different lengths to such a degree as to be visually distinguishable. It is preferable that these marks be provided on each substrate such that the tolerance with respect to the prescribed crystal orientation (the deviation in the direction of rotation of the plate surface) is as small as possible.

When affixing two substrates together, it is preferable that the two substrates be fixed by using a jig so that positions strictly agree between marks provided to the substrates. Specifically, the bonding may be performed by the following method: two kinds of orientation flats (a first orientation flat and a second orientation flat) are provided as the first and second marks mentioned above to each of two substrates such that the angle between extension lines of flat sides of the marks is 90°; when stacking the two substrates, they are stacked such that the positions of the first orientation flats and the positions of the second orientation flats are aligned; then, end surfaces of the first orientation flats and end surfaces of the second orientation flats are aligned and fixed by using an L-shaped quartz jig serving as a patch of 90°.

Before two substrates are bonded together in the above manner, it is preferable that the systematic error of the deflection orientation of the surface or the orientation flat after external shape processing of each substrate be found on a substrate basis by a Laue camera or an X-ray diffraction peak position, the systematic errors be used as a standard to sort the substrates so as to obtain a correction relationship whereby systematic errors are mutually canceled between a pair of substrates for affixing, and affixing be performed with these substrates as a pair. By this method, the tolerance in crystal orientation between the final substrates (the deviation in the direction of rotation of the plate surface) is limited to only components derived from accidental tolerances, and the yield of laminated substrates satisfying values within the target tolerance (for example, preferably less than or equal to 50 arcsec, and more preferably less than or equal to 20 arcsec) can be improved more.

The stacked substrate after affixing may be fixed to a triaxial goniometer, and the orientation of a crystal plane of each of the front and back of the stacked substrate may be measured by a Laue camera or an X-ray diffraction peak position; thereby, the tolerance at the time of bonding can be found from the difference between both orientations, and stacked substrates satisfying values within the target tolerance (for example, preferably less than or equal to 50 arcsec, and more preferably less than or equal to 20 arcsec) can be identified from the result of tolerance measurement.

As the method for bonding two substrates bonded in the above manner, an arbitrary method may be selected from means whereby atoms of the same kind of element can be continuously bonded together. For example, either one or both of the bonded surfaces of the two compound semiconductor substrates 3a and 3b may be subjected to surface activation treatment in advance, and then both substrates may be bonded together. Plasma activation treatment, vacuum ion beam treatment, or the treatment of immersion in ozone water may be performed as the surface activation treatment.

In the case where, among them, plasma activation treatment is performed, the compound semiconductor substrates 3a and 3b are mounted in a vacuum chamber, gas for plasma is introduced under reduced pressure, and then the compound semiconductor substrates 3a and 3b are exposed to high frequency plasma of approximately 100 W for approximately 5 to 10 seconds; thus, the surfaces are subjected to plasma activation treatment. Oxygen gas, hydrogen gas, nitrogen gas, or argon gas, a mixed gas of these, or a mixed gas of hydrogen gas and helium gas may be used as the gas for plasma.

As vacuum ion beam treatment, the compound semiconductor substrates 3a and 3b are mounted in a high vacuum chamber, and an ion beam of Ar or the like is applied to the surfaces to be bonded together; thus, activation treatment is performed.

As the treatment of immersion in ozone water, the compound semiconductor substrates 3a and 3b are immersed in ozone water in which ozone gas is dissolved, and the surfaces are thus subjected to activation treatment.

The surface activation treatment mentioned above is preferably performed under the same treatment conditions for both of the A-faces (or the B-faces) of the compound semiconductor substrates 3a and 3b. This is because the surface states of the substrates coincide strictly and it becomes easy to form a unipolar antiphase boundary. The surface activation treatment may be any one of the methods mentioned above, or may be a combined treatment. The surfaces subjected to surface activation treatment of the compound semiconductor substrates 3a and 3b are preferably surfaces to be bonded (bonded surfaces).

Next, after the compound semiconductor substrate 3a and the compound semiconductor substrate 3b are bonded together, heat treatment at preferably 150 to 350° C., more preferably 150 to 250° C., is performed to improve the bond strength between the bonded surfaces of the compound semiconductor substrate 3a and the compound semiconductor substrate 3b. Since the compound semiconductor substrate 3a and the compound semiconductor substrate 3b are materials of the same quality, the warpage of the substrate due to difference in thermal expansion coefficient is suppressed; however, a temperature suitable for each substrate may be employed to suppress warpage, as appropriate. The period of heat treatment is, although it depends on the temperature to some extent, preferably 2 to 24 hours.

Figure 3C:
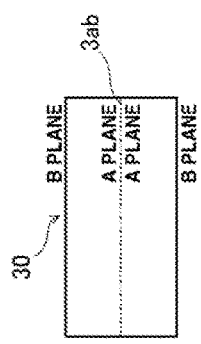

Thereby, the compound semiconductor substrate 3a and the compound semiconductor substrate 3b are strongly stuck together, and one compound semiconductor laminated substrate 30 is obtained (FIG. 3(c)).

Here, in FIG. 3, each of the front and back surfaces of the compound semiconductor laminated substrate 30 is a polar face (a B-face) that is made of atoms (B atoms) of the same kind of element among constituent elements and on which dangling bonds of atoms of the kind mentioned above are exposed. Alternatively, in the case where B-faces of the compound semiconductor substrates 3a and 3b are bonded together, each of the front and back surfaces of the compound semiconductor laminated substrate 30 is a polar face (an A-face) that is made of A atoms and on which dangling bonds of A atoms are exposed.

Further, in FIG. 3, in the interior of the compound semiconductor laminated substrate 30, a unipolar antiphase boundary 3ab that is parallel to the surfaces of the laminated substrate 30 and in which A atoms are bonded together is formed at the laminated interface. Alternatively, in the case where B-faces of the compound semiconductor substrates 3a and 3b are bonded together, in the interior of the compound semiconductor laminated substrate 30, a unipolar antiphase boundary 3ab that is parallel to the surfaces of the laminated substrate 30 and in which B atoms are bonded together is formed at the laminated interface. The antiphase boundary 3ab is the unipolar antiphase boundary 2ab described above, and is formed only of bonds of atoms of the same kind of element, i.e., cation-cation bonds (or anion-anion bonds); therefore, does not impair the blocking characteristics of the semiconductor device.

In the compound semiconductor laminated substrate 30 mentioned above, an epitaxial growth layer with a prescribed thickness in which the concentration of carriers is controlled may be formed on each of the front surface and the back surface, as an active layer of the semiconductor device. When manufacturing a substrate of silicon carbide, an epitaxial growth layer with a prescribed thickness can be formed by a method in which the laminated substrate 30 manufactured by the process mentioned above is mounted vertically on a boat made of polycrystalline silicon carbide, the temperature is increased up to 1,340° C. in a gas phase growth furnace, $SiH_2Cl_2$ at a flow rate of 200 sccm and $C_2H_2$ at a flow rate of 50 sccm are introduced, and the pressure is set to 15 Pa. The thickness of the epitaxial growth layer can be controlled by the period of growth, and the concentration of electrons and the concentration of holes can be controlled by mixing $N_2$ gas and trimethylaluminum or the like, respectively, in the growth gas, as appropriate.

Similar homoepitaxial growth layers are formed on both surfaces of the laminated substrate 30 by the above operation; on the other hand, when forming an epitaxial growth layer only on one surface, epitaxial growth operation may be performed while the surface not needing epitaxial growth is covered with an oxide film, or after epitaxial growth, polishing may be performed to remove the epitaxial growth layer.

In the above manner, a compound semiconductor laminated substrate that is free from influence due to difference between the polarities of surfaces in substrate processing and semiconductor device manufacturing and in which the motion of dislocations in the crystal is inhibited and blocking characteristics are not impaired is obtained.

In the case where, for example, compound semiconductor substrates 3a and 3b made of silicon carbide are used, the cation-face is a Si-face and the anion-face is a C-face; in the case where compound semiconductor substrates 3a and 3b made of gallium nitride are used, the cation-face is a Ga-face and the anion-face is a N-face; in the case where compound semiconductor substrates 3a and 3b made of gallium arsenic are used, the cation-face is a Ga-face and the anion-face is an As-face; in the case where compound semiconductor substrates 3a and 3b made of gallium phosphorus are used, the cation-face is a Ga-face and the anion-face is a P-face; in the case where compound semiconductor substrates 3a and 3b made of gallium nitride are used, the cation-face is a Ga-face and the anion-face is a N-face. In the present invention, cation-faces (or anion-faces) are bonded together to form a unipolar antiphase boundary made of cations (or anions), and anion-faces (or cation-faces) having the same polarity are formed on the front and back surfaces of the laminated substrate 30; thus, the action and effect of the present invention described above are obtained.

Second Embodiment

A second embodiment of the method for manufacturing a compound semiconductor laminated substrate according to the present invention is described using FIG. 5.

Figure 5A:
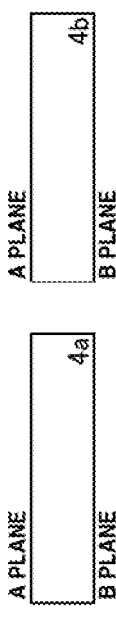
FIGS. 5A-5D are a diagram showing a manufacturing process in a second embodiment of a method for manufacturing a compound semiconductor laminated substrate according to the present invention.

First, single-crystalline compound semiconductor substrates 4a and 4b in each of which closest packed planes are oriented in the front surface and the back surface of the substrate are prepared (FIG. 5(a)). It is assumed that the compound semiconductor substrates 4a and 4b are the same as the compound semiconductor substrates 3a and 3b in the first embodiment.

Figure 5B:
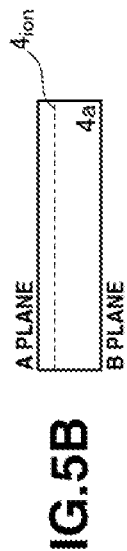

Next, for the compound semiconductor substrate 4a, which is one of the two compound semiconductor substrates 4a and 4b, hydrogen ions or the like are implanted in advance into the surface to be bonded to the other compound semiconductor substrate 4b, as treatment for separating the surface layer of the A-face (or the B-face) of the compound semiconductor substrate 4a, and an ion implantation region $4_{ion}$ is formed (FIG. 5(b)).

Here, at the time of ion implantation into the compound semiconductor substrate 4a, a prescribed dose of at least hydrogen ions ($H^+$) or hydrogen molecule ions ($H_2^+$) are implanted with such an implantation energy that the ion implantation region $4_{ion}$ can be formed to a desired depth from the surface. As conditions at this time, the ion implantation energy may be set so as to obtain the thickness of a desired thin film. Also He ions, B ions, or the like may be implanted simultaneously; any kind of ion may be employed as long as the same effect is obtained. However, the ions are preferably ions of a light element to the extent possible from the viewpoint of reducing damage to the compound semiconductor crystal lattice.

The dose amount of hydrogen ions ($H^+$) implanted into the compound semiconductor substrate 4a is preferably $1.0 \times 10^{16}$ atoms/cm$^2$ to $9.0 \times 10^{17}$ atoms/cm$^2$. If it is less than $1.0 \times 10^{16}$ atoms/cm$^2$, the embrittlement of the interface may not occur; if it is more than $9.0\times10^{17}$ atoms/cm², hydrogen ions may become air bubbles during heat treatment after affixing, and may cause transfer failure.

If hydrogen molecule ions ($H_2^+$) is used as implanted ions, the dose amount is preferably $5.0\times10^{15}$ atoms/cm² to $4.5\times10^{17}$ atoms/cm². If it is less than $5.0\times10^{15}$ atoms/cm², the embrittlement of the interface may not occur; if it is more than $4.5\times10^{17}$ atoms/cm², hydrogen ions may become air bubbles during heat treatment after the affixing, and may cause transfer failure.

The depth from the ion implantation surface of the substrate to the ion implantation region $4_{ion}$ (that is, an ion implantation depth) corresponds to a desired thickness of a compound semiconductor thin film $4a'$ that is a thinned compound semiconductor substrate provided on the compound semiconductor substrate $4b$; and is usually 100 to 2,000 nm, preferably 300 to 500 nm, and more preferably approximately 400 nm. The depth of the ion implantation region $4_{ion}$ (that is, an ion distribution thickness) may be such a thickness as to allow easy peeling by mechanical impact or the like, and is preferably 200 to 400 nm, and more preferably approximately 300 nm.

Next, it is preferable to perform surface treatment for making strictly equivalent the surface states of the A-face (or the B-face) that is the ion implantation surface of the compound semiconductor substrate $4a$ and the A-face (or the B-face) of the compound semiconductor substrate $4b$. This is because, if nonequivalent surfaces are bonded together, a bipolar APB like FIG. 12 is formed, and the characteristics of the semiconductor device are impaired. To this end, surface treatment is performed simultaneously under the same treatment conditions on the substrates $4a$ and $4b$ as a pair. The optimum surface treatment method depends on the material of the substrate; for example, in the case of a silicon carbide substrate, there is a method in which cleaning is performed with a mixed acid of hydrogen peroxide water and sulfuric acid, then the oxide film of the surface is removed by dilute hydrofluoric acid, and thereby a normal surface is obtained. Further, in order to prescribe the structure of the unipolar APB, heating may be performed in a hydrogen atmosphere to terminate the surface with hydrogen; thereby, the controllability of the surface polarity is enhanced, and an APB in a shuffle-set position as shown in FIG. 10 can be obtained as the bonded interface reliably.

Figure 5C:
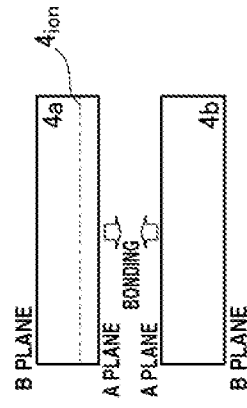

Next, in a state where specific crystal planes of both substrates $4a$ and $4b$ are aligned (that is, a state where a specific crystal orientation of the substrate $4a$ and a specific crystal orientation of the substrate $4b$ agree), the affixing and bonding are performed such that the A-faces (or the B-faces) are directly in contact, that is, the A-faces (or the -faces) that have undergone surface activation treatment of the compound semiconductor substrates $4a$ and $4b$ are bonded together as the bonded surfaces (FIG. 5(c)). Here, the bonding method, the surface activation method, etc. may be the same methods as the first embodiment.

Next, after the compound semiconductor substrate $4a$ and the compound semiconductor substrate $4b$ are bonded together, heat treatment at preferably 150 to 350° C., more preferably 150 to 250° C., is performed to improve the bond strength between the bonded surfaces of the compound semiconductor substrate $4a$ and the compound semiconductor substrate $4b$. Since the compound semiconductor substrate $4a$ and the compound semiconductor substrate $4b$ are materials of the same quality, the warpage of the substrate due to difference in thermal expansion coefficient is suppressed; however, a temperature suitable for each substrate may be employed to suppress warpage, as appropriate. The period of heat treatment is, although it depends on the temperature to some extent, preferably 2 to 24 hours.

Figure 5D:
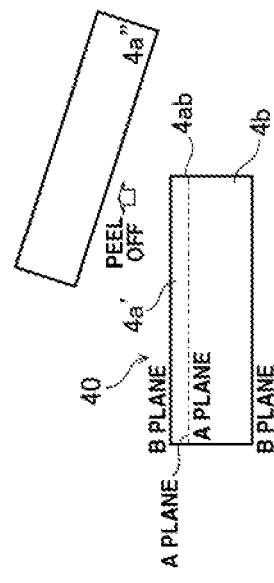

Thermal energy or mechanical energy is applied to the ion implantation portion of the substrate bonded in the above manner; thereby, the surface layer of the compound semiconductor substrate $4a$ is peeled off at the ion implantation region $4_{ion}$, and a single-crystalline compound semiconductor thin film $4a'$ is transferred onto the compound semiconductor substrate $4b$; thus, a compound semiconductor laminated substrate 40 is obtained (FIG. 5(d)).

Here, as the peeling method, for example, a thermal peeling method may be used in which the bonded substrate mentioned above is heated to high temperature, minute bubble bodies of ion implantation components are generated by the heat in the ion implantation region $4_{ion}$ to make peeling, and the compound semiconductor substrate $4a$ is separated. Alternatively, a mechanical peeling method may be used in which, while low temperature heat treatment (for example, 500 to 900° C., preferably 500 to 700° C.) at a level that does not cause thermal peeling is performed, physical impact is applied to one end of the ion implantation region $4_{ion}$ to make peeling mechanically, and the compound semiconductor substrate $4a$ is separated. In the mechanical peeling method, the roughness of the transfer surface after the transfer of a single-crystalline compound semiconductor thin film is smaller than that in the heat peeling method; thus, the mechanical peeling method is more preferable.

After peeling processing, heat treatment may be performed that improves stickiness with the compound semiconductor thin film $4a'$ by heating the compound semiconductor substrate $4b$ under conditions of a heating temperature that is in the range of 700 to 1,000° C. and is higher than that at the time of peeling processing and a heating time of 1 to 24 hours. At this time, since the thin film $4a'$ is strongly stuck to the compound semiconductor substrate $4b$, peeling in portions other than the peeling portion of the ion implantation region $4_{ion}$ does not occur.

The single-crystalline compound semiconductor substrate $4a''$ after being peeled off can be reused again as a single-crystalline compound semiconductor substrate by performing polishing, cleaning, etc. on the surface again.

Thereby, the compound semiconductor thin film $4a'$ and the compound semiconductor substrate $4b$ are strongly stuck together, and one compound semiconductor laminated substrate 40 is obtained (FIG. 5(d)).

Here, in FIG. 5, each of the front and back surfaces of the compound semiconductor laminated substrate 40 is a polar face (a B-face) that is made of atoms (B atoms) of the same kind of element among constituent elements and on which dangling bonds of atoms of the kind mentioned above are exposed. Alternatively, in the case where B-faces of the compound semiconductor substrates $4a$ and $4b$ are bonded together, each of the front and back surfaces of the compound semiconductor laminated substrate 40 is a polar face (an A-face) that is made of A atoms and on which dangling bonds of A atoms are exposed.

Further, in FIG. 5, in the interior of the compound semiconductor laminated substrate 40, an antiphase boundary $4ab$ that is parallel to the surfaces of the laminated substrate 40 and in which either A atoms or B atoms are bonded together is formed at the laminated interface. Alternatively, in the case where B-faces of the compound semiconductor substrates $4a$ and $4b$ are bonded together, in the interior of the compound semiconductor laminated substrate 40, an antiphase boundary $4ab$ that is parallel to the surfaces of the laminated substrate 40 and in which either A atoms or B atoms are bonded together is formed at the laminated interface. The antiphase boundary 4ab is the unipolar antiphase boundary 2ab described above, and is formed only of bonds of atoms of the same kind of element, i.e., cation-cation bonds (or anion-anion bonds).

In the compound semiconductor laminated substrate 40 mentioned above, an epitaxial growth layer with a prescribed thickness in which the concentration of carriers is controlled may be formed on each of the front surface and the back surface, as an active layer of the semiconductor device. When manufacturing a substrate of silicon carbide, an epitaxial growth layer with a prescribed thickness can be formed by a method in which the laminated substrate 40 manufactured by the process mentioned above is mounted vertically on a boat made of polycrystalline silicon carbide, the temperature is increased up to 1,340° C. in a gas phase growth furnace, $SiH_2Cl_2$ at a flow rate of 200 sccm and $C_2H_2$ at a flow rate of 50 sccm are introduced, and the pressure is set to 15 Pa. The thickness of the epitaxial growth layer can be controlled by the period of growth, and the concentration of electrons and the concentration of holes can be controlled by mixing $N_2$ gas and trimethylaluminum or the like, respectively, in the growth gas, as appropriate.

Similar homoepitaxial growth layers are formed on both surfaces of the laminated substrate 40 by the above operation; on the other hand, when forming an epitaxial growth layer only on one surface, epitaxial growth operation may be performed while the surface not needing epitaxial growth is covered with an oxide film, or after epitaxial growth, polishing may be performed to remove the epitaxial growth layer.

By using the laminated substrate 40 obtained in the above manner, there is no influence due to difference between the polarities of surfaces in substrate processing or semiconductor device manufacturing, and the motion of dislocations in the crystal is inhibited. For example, Non-Patent Document 2 reports that silicon carbide with a density of stacking faults of less than or equal to 120/cm can be formed by inhibiting the motion of dislocations, and Non-Patent Document 3 reports that the density of leakage current at a p-n junction of silicon carbide can be made less than or equal to 0.1 mA by suppressing the density of stacking faults to less than or equal to 60,000/cm² (less than or equal to 245/cm). When a compound semiconductor laminated substrate made of silicon carbide according to the present invention is used, a semiconductor device in which blocking characteristics are not impaired is obtained.

Similarly; in the case where compound semiconductor substrates 4a and 4b made of gallium nitride are used, the cation-face is a Ga-face and the anion-face is a N-face; in the case where compound semiconductor substrates 4a and 4b made of gallium arsenic are used, the cation-face is a Ga-face and the anion-face is an As-face; in the case where compound semiconductor substrates 4a and 4b made of gallium phosphorus are used, the cation-face is a Ga-face and the anion-face is a P-face; in the case where compound semiconductor substrates 4a and 4b made of gallium nitride are used, the cation-face is a Ga-face and the anion-face is a N-face. In the present invention, cation-faces (or anion-faces) are bonded together to form a unipolar antiphase boundary made of cations (or anions), and anion-faces (or cation-faces) having the same polarity are formed on the front and back surfaces of the laminated substrate 40; thus, the action and effect of the present invention described above are obtained.

Third Embodiment

A third embodiment of the method for manufacturing a compound semiconductor laminated substrate according to the present invention is described using FIG. 6. The third embodiment is a case where a compound semiconductor substrate in which a homoepitaxial growth layer is formed in advance on the surface of the compound semiconductor substrate 4a to be bonded to the compound semiconductor substrate 4b is used as the compound semiconductor substrate 4a in the second embodiment above.

Figure 6A:
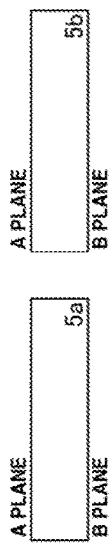
FIGS. 6A-6E are a diagram showing a manufacturing process in a third embodiment of a method for manufacturing a compound semiconductor laminated substrate according to the present invention.

First, single-crystalline compound semiconductor substrates 5a and 5b in each of which closest packed planes are oriented in the front surface and the back surface of the substrate are prepared (FIG. 6(a)). It is assumed that the compound semiconductor substrates 5a and 5b are the same as the compound semiconductor substrates 3a and 3b in the first embodiment. Herein, the substrate 5a may be referred to as a transfer substrate, and the substrate 5b may be referred to as a support substrate.

Figure 6B:
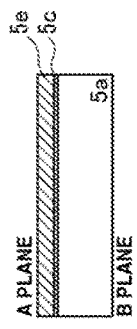

Next, for the compound semiconductor substrate 5a, which is one of the two compound semiconductor substrates 5a and 5b, a homoepitaxial growth layer 5e of the same compound as the substrate 5a is formed on the surface to be bonded to the other compound semiconductor substrate 5b (FIG. 6(b)). That is, an epitaxial crystal having the same compound and the same atomic arrangement as the substrate 5a is grown in a layer form on one major surface of the substrate 5a.

As the method of homoepitaxial growth, a known epitaxial growth method may be used; for example, a gas phase epitaxial growth method is preferable.

The thickness of the homoepitaxial growth layer 5e is preferably 500 nm to 5 µm, and more preferably 600 nm to 1 µm. Thereby, part of the homoepitaxial growth layer 5e can be transferred in a layer form onto the substrate 5b by an ion implantation transfer method described later.

A buffer layer 5c obtained by doping the same compound with an impurity may be formed between the compound semiconductor substrate 5a and the homoepitaxial growth layer 5e, and thereby crystal defects exposed on the surface of the substrate 5a can be prevented from propagating to the homoepitaxial growth layer 5e; thus, this is preferable (FIG. 6(b)). The thickness of the buffer layer 5c is preferably 100 to 1,000 nm.

Here, since the homoepitaxial growth layer 5e is formed on an A-face (a cation-face) of the substrate 5a, also the surface of the homoepitaxial growth layer 5e is an A-face (a cation-face). In the case where the homoepitaxial growth layer 5e is provided on a B plane of the substrate 5a, the surface of the homoepitaxial growth layer 5e is a B-face (an anion-face).

Figure 6C:
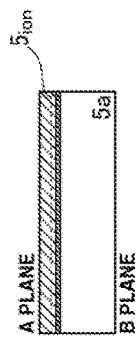

Next, for one compound semiconductor substrate 5a, hydrogen ions or the like are implanted in advance into the surface to be bonded to the other compound semiconductor substrate 5b, that is, into the homoepitaxial growth layer 5e, as treatment for separating the surface layer of the A-face (or the B-face) of the homoepitaxial growth layer 5e, and an ion implantation region $5_{ion}$ is formed (FIG. 6(c)). The ion implantation treatment method at this time may be the same as that of the second embodiment.

Note that the depth from the ion implantation surface of the substrate to the ion implantation region $5_{ion}$ (that is, an ion implantation depth) corresponds to a desired thickness of a homoepitaxial growth layer 5e' that is a thinned compound semiconductor substrate provided on the compound semiconductor substrate 5b; and is usually 100 to 2,000 nm, preferably 300 to 500 nm, and more preferably approximately 400 nm. The depth of the ion implantation region $5_{ion}$ (that is, an ion distribution thickness) may be such a thickness as to allow easy peeling by mechanical impact or the like, and is preferably 200 to 400 nm, and more preferably approximately 300 nm.

Next, it is preferable to perform surface treatment for making strictly equivalent the surface states of at least the bonded surfaces of the semiconductor substrates 5a and 5b. This is because, if nonequivalent surfaces are bonded together, a bipolar APB like FIG. 12 is occurred, and the characteristics of the semiconductor device are impaired. To this end, surface treatment is performed simultaneously under the same treatment conditions on the substrates 5a and 5b as a pair. The optimum surface treatment method depends on the material of the substrate; for example, in the case of a silicon carbide substrate, there is a method in which cleaning is performed with a mixed acid of hydrogen peroxide water and sulfuric acid, then the oxide film of the surface is removed by dilute hydrofluoric acid, and thereby a normal surface is obtained. Further, in order to prescribe the structure of the unipolar APB, heating may be performed in a hydrogen atmosphere to terminate the surface with hydrogen; thereby, the controllability of the surface polarity is enhanced, and an APB in a shuffle-set position as shown in FIG. 10 can be obtained reliably.

Figure 6D:
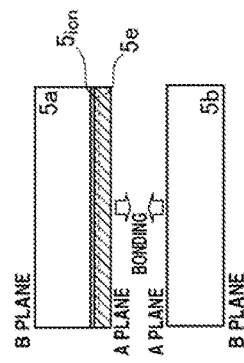

Next, in a state where specific crystal planes of both substrates 5a and 5b are aligned (that is, a state where a specific crystal orientation of the substrate 5a and a specific crystal orientation of the substrate 5b agree), the A-face (or the B-face) that is the ion implantation surface of the compound semiconductor substrate 5a (that is, the homoepitaxial growth layer 5e) and the A-face (or the B-face) of the compound semiconductor substrate 5b are affixed and bonded together such that the A-faces (or the B planes) are directly in contact, that is, the A-faces (or the B-faces) that have undergone surface activation treatment of the compound semiconductor substrate 5a (the homoepitaxial growth layer 5e) and the compound semiconductor substrate 5b are bonded together as the bonded surfaces (FIG. 6(d)). The bonding method, the surface cleaning method, the surface activation method, etc. at this time may be the same methods as the first embodiment.

Next, after the compound semiconductor substrate 5a (the homoepitaxial growth layer 5e) and the compound semiconductor substrate 5b are bonded together, heat treatment at preferably 150 to 350° C., more preferably 150 to 250° C., is performed to improve the bond strength between the bonded surfaces of the homoepitaxial growth layer 5e and the compound semiconductor substrate 5b. Since the compound semiconductor substrate 5a (the homoepitaxial growth layer 5e) and the compound semiconductor substrate 5b are materials of the same quality, the warpage of the substrate due to difference in thermal expansion coefficient is suppressed; however, a temperature suitable for each substrate may be employed to suppress warpage, as appropriate. The period of heat treatment is, although it depends on the temperature to some extent, preferably 2 to 24 hours.

Figure 6E:
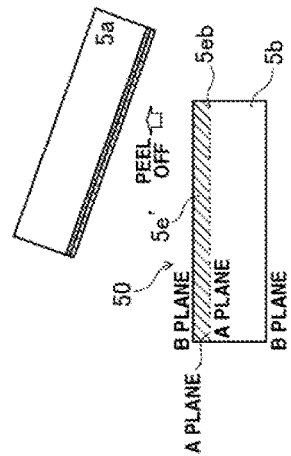
Figure 7:
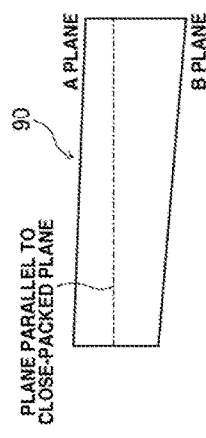
FIG. 7 is a cross-sectional view showing a configuration of a conventional compound semiconductor substrate in which small inclination processing optimum for epitaxial growth has been performed on polar faces.
Figure 8:
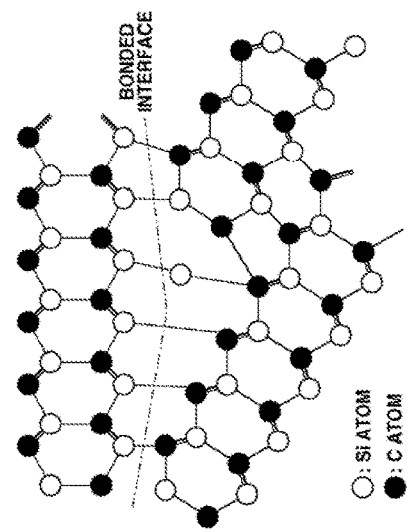
FIG. 8 is a schematic cross-sectional view showing a lattice configuration of an interface at which crystals having different angles of inclination are bonded together (a tilt angle grain boundary).
Figure 9:
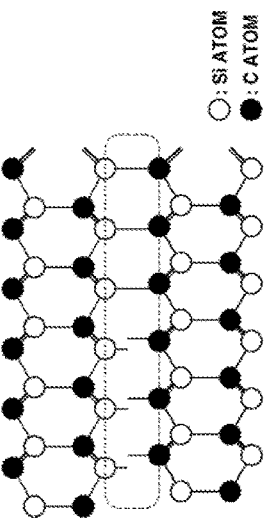
FIG. 9 is a schematic cross-sectional view showing a lattice configuration of an interface at which crystals in a relationship of rotation with a crystallographic axis as the center are bonded together (a twist grain boundary).

Thermal energy or mechanical energy is applied to the ion implantation portion of the substrate bonded in the above manner; thereby, the surface layer of the homoepitaxial growth layer 5e is peeled off at the ion implantation region $5_{ion}$, and a single-crystalline compound semiconductor thin film 5e' is transferred onto the compound semiconductor substrate 5b; thus, a compound semiconductor laminated substrate 50 is obtained (FIG. 6(e)). The peeling method at this time may be the same as that of the second embodiment. As necessary, heat treatment that improves stickiness may be performed.

The single-crystalline compound semiconductor substrate 5a after being peeled off can be reused again as a single-crystalline compound semiconductor substrate by performing polishing, cleaning, etc. on the surface again.

Thereby, the compound semiconductor thin film 5e' and the compound semiconductor substrate 5b are strongly stuck together, and one compound semiconductor laminated substrate 50 is obtained (FIG. 6(e)).

Here, in FIG. 6, each of the front and back surfaces of the compound semiconductor laminated substrate 50 is a polar face (a B-face) that is made of atoms (B atoms) of the same kind of element among constituent elements and on which dangling bonds of atoms of the kind mentioned above are exposed. Alternatively, in the case where B-faces of the compound semiconductor substrate 5a (the homoepitaxial growth layer 5e) and the compound semiconductor substrate 5b are bonded together, each of the front and back surfaces of the compound semiconductor laminated substrate 50 is a polar face (an A-face) that is made of A atoms and on which dangling bonds of A atoms are exposed.

Further, in FIG. 6, in the interior of the compound semiconductor laminated substrate 50, an antiphase boundary 5eb that is parallel to the surfaces of the laminated substrate 50 and in which A atoms are bonded together is formed at the laminated interface. Alternatively, in the case where B-faces of the compound semiconductor substrate 5a (the homoepitaxial growth layer 5e) and the compound semiconductor substrate 5b are bonded together, in the interior of the compound semiconductor laminated substrate 50, an antiphase boundary 5eb that is parallel to the surfaces of the laminated substrate 50 and in which B atoms are bonded together is formed at the laminated interface. The antiphase boundary 5eb is the unipolar antiphase boundary 2ab described above, and is formed only of bonds of atoms of the same kind of element, i.e., cation-cation bonds (or anion-anion bonds).

In the compound semiconductor laminated substrate 50 mentioned above, an epitaxial growth layer with a prescribed thickness in which the concentration of carriers is controlled may be formed on each of the front surface and the back surface, as an active layer of the semiconductor device. When manufacturing a substrate of silicon carbide (3C-SiC), for example, an epitaxial growth layer with a prescribed thickness can be formed by a method in which the laminated substrate 50 manufactured by the process mentioned above is mounted vertically on a boat made of polycrystalline silicon carbide, the temperature is increased up to 1,340° C. in a gas phase growth furnace, $SiH_2Cl_2$ at a flow rate of 200 sccm and $C_2H_2$ at a flow rate of 50 sccm are introduced, and the pressure is set to 15 Pa. The thickness of the epitaxial growth layer can be controlled by the period of growth, and the concentration of electrons and the concentration of holes can be controlled by mixing $N_2$ gas and trimethylaluminum or the like, respectively, in the growth gas, as appropriate.

Similar homoepitaxial growth layers are formed on both surfaces of the laminated substrate 50 by the above operation; on the other hand, when forming an epitaxial growth layer only on one surface, epitaxial growth operation may be performed while the surface not needing epitaxial growth is covered with the oxide film, or after epitaxial growth, polishing may be performed to remove the epitaxial growth layer.

By using the laminated substrate 50 obtained in the above manner, there is no influence due to difference between the polarities of surfaces in substrate processing or semiconductor device manufacturing, and the motion of dislocations in the crystal is inhibited. For example, Non-Patent Document 2 reports that silicon carbide with a density of stacking faults of less than or equal to 120/cm can be formed by inhibiting the motion of dislocations, and Non-Patent Document 3 reports that the density of leakage current at a p-n junction of silicon carbide can be made less than or equal to 0.1 mA by suppressing the density of stacking faults to less than or equal to 60,000/cm$^2$ (less than or equal to 245/cm). When a compound semiconductor laminated substrate made of silicon carbide according to the present invention is used, a semiconductor device in which blocking characteristics are not impaired is obtained.

Similarly; in the case where compound semiconductor substrate 5a (the homoepitaxial growth layer 5e) and the compound semiconductor substrate 5b made of gallium nitride are used, the cation-face is a Ga-face and the anion-face is a N-face; in the case where compound semiconductor substrate 5a (the homoepitaxial growth layer 5e) and the compound semiconductor substrate 5b made of gallium arsenic are used, the cation-face is a Ga-face and the anion-face is an As-face; in the case where compound semiconductor substrate 5a (the homoepitaxial growth layer 5e) and the compound semiconductor substrate 5b made of gallium phosphorus are used, the cation-face is a Ga-face and the anion-face is a P-face; in the case where compound semiconductor substrate 5a (the homoepitaxial growth layer 5e) and the compound semiconductor substrate 5b made of gallium nitride are used, the cation-face is a Ga-face and the anion-face is a N-face. In the present invention, cation-faces (or anion-faces) are bonded together to form a unipolar antiphase boundary made of cations (or anions), and anion-faces (or cation-faces) having the same polarity are formed on the front and back surfaces of the laminated substrate 50; thus, the action and effect of the present invention described above are obtained.

EXAMPLES

In the following, the present invention is described more specifically using Examples; however, the present invention is not limited to the descriptions of these Examples.

Example 1

The compound semiconductor laminated substrate 30 having a unipolar antiphase boundary (an APB) shown in FIG. 3(c) corresponding to the first embodiment and a laminated substrate not having a unipolar APB were manufactured and evaluated.

First, four kinds of single-crystal 4H-SiC wafers each with a diameter of 4 inches manufactured by II-VI Inc. were prepared. For four first wafers W11 and two second wafers W12, the front surface of each wafer was made to be the (0001) Si-face; for one third wafer W13, the front surface was made to be the (000-1) C-face. The tolerance between the normal axis to the surface of each wafer and the [0001] axis is within 0.3 degrees. For one fourth wafer W14, the front surface was made to be an A-face inclined 4 degrees to the [11-20] orientation from the (0001) Si-face. In each wafer, a first orientation flat parallel to the [11-20] orientation and a second orientation flat parallel to the [1-100] orientation were provided, and the length of the first orientation flat was set to 38.5 mm and the length of the second orientation flat was set to 18 mm. Wafer W11 was processed such that there was a relationship where, when the front surface was viewed, the first orientation flat was in the 6 o'clock direction of a clock and the second orientation flat was in the 3 o'clock direction of the clock. Wafers W12, W13, and W14 were processed such that there was a relationship where, when the front surface was viewed, the first orientation flat was in the 6 o'clock direction of a clock and the second orientation flat was in the 9 o'clock direction of the clock.

Wafer W11 serves as a support substrate portion (a base) (corresponding to the substrate 3b of FIG. 3) of a laminated body after an affixing process described later, and hence needs to keep mechanical strength; thus, the thickness of the wafer was set to 0.5 mm. On the other hand, the thickness of each of wafers W12, W13, and W14 was set to 0.15 mm.

The front surface and the back surface of each of such wafers W11, W12, W13, and W14 were subjected to mechanical polishing treatment and chemical mechanical polishing (CMP), and the arithmetic average roughness of the surface (Ra; JIS B0601, 2013; the same applies hereinafter) was made less than or equal to 0.2 nm. The reason whey smoothing is thus performed is that it is attempted to reduce the area of the unbonded region in a wafer bonding process described later. Then, wafers W11, W12, W13, and W14 were simultaneously cleaned with a mixed acid of hydrogen peroxide water and sulfuric acid under the same treatment conditions (SPM cleaning), and then the oxide film of the each surface was removed by dilute hydrofluoric acid treatment (HF treatment). Next, the wafers were simultaneously immersed for 10 minutes in ozone water in which ozone gas was dissolved, and the each surface was activated. Next, heat treatment at 700° C. was performed in a hydrogen atmosphere for 10 minutes to terminate the surface of the each substrate with hydrogen, and the polarities of the substrates were equalized.

Next, for 2 sets of combination of wafer W11 and wafer W12, a combination of wafer W11 and wafer W13, and a combination of wafer W11 and wafer W14, the bonding was performed such that the front surfaces of the wafers were in contact in each combination. At this time, the end surfaces of the orientation flats were aligned by using an L-shaped quartz jig in such a manner that the positions of the first orientation flats and the positions of the second orientation flats of the wafers coincided with each other accurately in 1 set (Example) out of the combinations of wafer W11 and wafer W12, and in the combination of wafer W11 and wafer W13 (Comparison 1). In this case, the tolerance between the end surfaces of the wafers that were in contact was within 20 arcsec.

In the other set (Comparison 2) out of the combinations of wafer W11 and wafer W12, the first orientation flat of wafer W12 was set in a position more than or equal to 2 degrees counterclockwise from the first orientation flat of wafer W11. Due to such rotation, the interface after the bonding described later forms not a matched interface but a twist grain boundary.

In the combination of wafer W11 and wafer W14 (Comparison 3), the end surfaces of the orientation flats were aligned by using an L-shaped quartz jig in such a manner that the positions of the first orientation flats and the positions of the second orientation flats of the wafers coincided with each other accurately. In this case, the tolerance between the end surfaces of the wafers that were in contact was within 20 arcsec. In the combination of wafer W11 and wafer W14, since the crystal lattice of wafer W14 is inclined with respect to wafer W11 at the affixed interface, the interface after the bonding described later forms not a matched interface but a tilt angle grain boundary.

Here, the wafer integrated by affixing with wafer W11 and wafer W12 in 1 set (Example) out of the combinations of wafer W11 and wafer W12 is referred to as W112, and the wafer integrated by affixing with wafer W11 and wafer W13 in the combination of wafer W11 and wafer W13 (Comparison 1) is referred to as W113. Further, the wafer integrated by affixing with wafer W11 and wafer W12 in the other set (Comparison 2) out of the combinations of wafer W11 and wafer W12 is referred to as W112', and the wafer integrated by affixing with wafer W11 and wafer W14 in the combination of wafer W11 and wafer W14 (Comparison 3) is referred to as W114.

In wafer W112, the bonded interface is formed of a unipolar APB of Si—Si bonds, and the front surface and the back surface are C-faces. On the other hand, in wafer W113, the bonded interface is formed of Si—C bonds, and does not include an APB. The front surface side of wafer W113 (corresponding to the back surface of wafer W13) is a Si-face, and the back surface side of wafer W113 (corresponding to the back surface of wafer W11) is a C-face. In wafers W112' and W114, the front surface and the back surface are C-faces; however, the bonded interface is not necessarily a unipolar APB in which Si atoms are bonded together, but may be formed of a bipolar APB and a twist grain boundary, or a tilt angle grain boundary. Hence, when a p-n junction or a Schottky electrode is provided and a space-charge region is spread in the bonded interface, the space-charge region behaves as a carrier leakage path.

Next, heat treatment at 250° C. for 24 hours was performed on each of wafers W112, W113, W112', and W114, and the bonding strength of the bonded interface was enhanced.

Here, various crystal defects are exposed on surfaces of compound semiconductor substrates or compound semiconductor laminated substrates; defects predominant in these substrates are basal plane dislocations (BPDs) and threading dislocations (TDs). Although each defect cannot be visually observed, observation becomes possible by a method in which a crystal of potassium hydroxide (KOH) is mounted on a surface of a wafer or a surface of an epitaxial growth layer and is melted by heating to 500° C., thereby the etching of defects is promoted, and the defects are made noticeable (this is referred to as molten KOH etching). Herein, the density of defects was found by, in a surface observed after molten KOH etching, counting defects observed in a plurality of fields of view of an optical microscope with a magnifying power of 100 (the same applies to Examples below).

First, molten KOH etching was performed on each of the surfaces on the wafer W12 side, the surface on the W13 side, and the surface on the W14 side of wafers W112, W113, W112', and W114 obtained in the above manner, and the density of BPDs exposed on the surface was measured; thus, it was found that the densities of BPDs of wafers W112, W113, W112', and W114 were substantially equal and were 7,900 to 12,000/cm².

Next, for wafers W112, W113, W112', and W114, heat treatment at 1,650° C. for 300 minutes was performed as heat treatment corresponding to homoepitaxial growth, then molten KOH etching was performed, and the density of BPDs of the surface of the wafer (the surfaces on the wafer W12 side, the surface on the W13 side, and the surface on the W14 side) was measured. As a result, it was found that the density was 9,500/cm² in wafer W112, but was twice or more in the other laminated wafers, namely, 21,000/cm² in wafer W113, 26,000/cm² in wafer W112', and 31,000/cm² in wafer W114.

It is presumed that, in wafer W112, which is a laminated substrate of the present invention, a unipolar APB formed at the bonded interface obstructed the extension (propagation) of BPDs from the wafer W11 side to wafer W12 in the laminated substrate and suppressed the increase in the density of BPDs. On the other hand, it is presumed that, in wafer W113 for comparison, since an APB was not formed at the laminated interface, BPDs propagated from the wafer W11 side to wafer W13 in the laminated substrate and the density of BPDs was increased. Further, it is presumed that, in wafers W112' and W114 for comparison, since a unipolar APB was not formed at the laminated interface, new BPDs occurred due to a mismatched interface that had occurred along with a bipolar APB and the density of BPDs was increased.

In the present Example, a silicon carbide substrate with a relatively large density of defects was used as wafer W12; on the other hand, in the case where wafer W112 is manufactured by using a silicon carbide substrate with a low density of defects as wafer W12, even when the density of defects of the surface of wafer W11 is large, the propagation of these defects is blocked by an APB; thus, a silicon carbide laminated substrate with a low density of defects similar to the surface of wafer W12 can be obtained. As the silicon carbide substrate with a low density of defects, for example, a silicon carbide substrate with a low density of defects manufactured by a method described in JP-A 2003-119097 may be used.

Example 2

The compound semiconductor laminated substrate 40 having a unipolar antiphase boundary (an APB) shown in FIG. 5(d) corresponding to the second embodiment and a laminated substrate not having a unipolar APB were manufactured and evaluated.

First, three kinds of single-crystal 4H-SiC substrates (wafers) each with a diameter of 4 inches were prepared. Among them, each of two first wafers W21 serves as a support substrate portion of a laminated body (corresponding to the substrate 4b of FIG. 5), and is a wafer in which the (0001) Si-face is oriented in a direction inclined 4 degrees to the [11-20] orientation from the normal axis to the front surface. One second wafer W22 (corresponding to the substrate 4a of FIG. 5) is a wafer in which the (0001) Si-face is oriented in a direction inclined 4 degrees to the [−1-120] orientation from the normal axis to the front surface (a transfer substrate). Each of two third wafers W23 (for comparison) is a wafer in which the (000-1) C-face is oriented in a direction inclined 4 degrees to the [−1-120] orientation from the normal axis to the front surface (a transfer substrate). The reason why a slightly inclined substrate is thus used is that it is attempted to achieve step control epitaxy in which the depositing order of crystal planes in the [0001] axis direction is propagated in the lateral direction to keep the polytype of the crystal (keep the atomic arrangement). Further, the reason why the direction of small inclination of the target plane is set opposite between wafer W21 and wafers W22 and W23 is that it is attempted to form a matched interface by suppressing the occurrence of a tilt angle grain boundary when the surfaces are bonded together.

Each wafer was provided with a first orientation flat parallel to the [11-20] orientation and a second orientation flat parallel to the [1-100] orientation. The length of the first orientation flat was set to 38.5 mm, and the length of the second orientation flat was set to 18 mm. Wafer W21 was processed such that there was a relationship where, when the front surface was viewed, the first orientation flat was in the 6 o'clock direction of a clock and the second orientation flat was in the 3 o'clock direction of the clock. Wafers W22 and W23 were processed such that there was a relationship where, when the front surface was viewed, the first orientation flat was in the 6 o'clock direction of a clock and the second orientation flat was in the 9 o'clock direction of the clock. The thickness of each wafer is 0.5 mm.

All the densities of BPDs of wafers W21, W22, and W23 measured by the molten KOH etching described above were substantially equal, and were 9,300 to 11,000/cm$^2$.

Next, each surface of the wafer was subjected to chemical mechanical polishing (CMP) treatment to reduce the arithmetic average roughness Ra of the surface to less than or equal to 0.2 nm. The reason why smoothing is thus performed is that it is attempted to reduce the occurrence of an unbonded region or a bipolar APB in a wafer bonding process described later.

Next, a surface of each of wafers W22 and W23 was provided with a vulnerable layer (corresponding to the ion implantation region $4_{ion}$ of FIG. 5(b)). This is treatment for transferring only the surface layer of each of wafers W22 and W23 onto wafer W21 after each of wafers W22 and W23 is brought into contact with and bonded to wafer W21. To this end, a surface to be bonded of each of wafers W22 and W23 was implanted with hydrogen ions to form the ion implantation region $4_{ion}$ shown in FIG. 5(b). The dose amount of hydrogen ions (H$^+$) implanted was set to $1.0\times10^{17}$ atoms/cm$^2$, and the ion acceleration energy was set to 65 keV so that the depth of the vulnerable layer might be 400 nm.

Then, wafers W21, W22, and W23 were simultaneously cleaned with a mixed acid of hydrogen peroxide water and sulfuric acid under the same treatment conditions (SPM cleaning), and then the oxide film of the surface was removed by dilute hydrofluoric acid treatment (HF treatment). Next, heat treatment at 700° C. was performed in a hydrogen atmosphere for 10 minutes to terminate the surface of the substrate with hydrogen, and the polarities of the substrates were equalized.

Next, the front surface of each of wafers W22 and W23 was brought into contact with and bonded to the front surface of wafer W21 (corresponding to the processing shown in FIG. 5(c)). Here, each front surface of the wafer before contacting was irradiated with Ar plasma under the same treatment conditions, and was activated. Further, similarly to Example 1, affixing was performed while, using an L-shaped quartz jig, the orientation of the orientation flat of each of wafers W22 and W23 was made to coincide with the orientation of the orientation flat of wafer W21 (that is, in such a manner that the positions of the first orientation flats and the positions of the second orientation flats of the wafers coincided with each other accurately), and the deviation of the crystal plane in the [11-20] orientation was made less than or equal to 20 arcsec.

Thereby, the densities of mismatched interfaces (interfaces at which crystal lattices are discontinuous) between wafer W21 and wafer W22 and between wafer W21 and wafer W23 are reduced to a negligible level.

Here, attention is focused on the difference between the wafer W21/W22 interface and the wafer W21/W23 interface. At the interface between wafer W21 and wafer W22, Si polar faces face each other, and therefore Si—Si bonds exist. That is, a unipolar antiphase boundary (APB) of a monomolecular layer exists. On the other hand, at the interface between wafer W21 and wafer W23, a C polar face of wafer W23 faces a Si polar face of wafer W21. Hence, the interface is formed of Si—C bonds, and an APB does not exist at the interface.

Next, each of the bonded body of wafers W21 and W22 and the bonded body of wafers W21 and W23 was heated to 800° C. to cause breaking at the vulnerable layer formed by hydrogen ion implantation, and only a thin film layer with a thickness of 400 nm was allowed to remain (transferred) on the surface of wafer W21 (corresponding to the processing shown in FIG. 5(d)). The wafer in which a thin film layer on the wafer W22 side was transferred to the surface of wafer W21 by breaking is referred to as W212, and the wafer in which a thin film layer on the wafer W23 side was transferred to the surface of wafer W21 is referred to as W213. The arithmetic average roughness Ra of the surface of each of wafers W212 and W213 was increased to more than 1 nm due to the breaking processing, and thus CMP treatment was performed to reduce the arithmetic average roughness Ra of the surface to less than or equal to 0.2 nm.

Next, another round of homoepitaxial growth was performed on the surface of each of wafers W212 and W213. Prior to homoepitaxial growth, wafers W212 and W213 were separately placed in an epitaxial growth apparatus, then hydrogen at 3 slm was introduced, and the temperature was increased to 1,600° C. under a pressure of 13 Pa. Upon a lapse of 10 minutes after the temperature reached 1,600° C., which lapse was in order to equalize the temperature in the epitaxial growth apparatus, SiH$_4$ gas and C$_3$H$_8$ gas were additionally introduced and epitaxial growth was started. For wafer W213, the rates of flow of SiH$_4$ gas and C$_3$H$_8$ gas were set to 10 sccm and 8 sccm, respectively, because a Si-face was exposed on the surface; for wafer W212, the rates of flow of SiH$_4$ gas and C$_3$H$_8$ gas were set to 8 sccm and 10 sccm, respectively. Treatment for 75 minutes under these conditions was continued to perform homoepitaxial growth of 10 μm. The fact that the homoepitaxial growth layer exhibited electrical conductivity of an n-type and the concentration of remaining carriers was $3\times10^{15}$/cm$^3$ was found by capacitance-voltage measurement (C-V measurement) performed later.

Next, in order to measure the density of defects of the surface of the epitaxial growth layer formed on each of wafers W212 and W213, potassium hydroxide was mounted on the surface and was melted by heating at 500° C. for 5 minutes, and thereby the etching of defects was promoted and noticeable-making treatment was performed. As a result of the measurement by molten KOH etching, it was found that the density of BPDs of the surface of wafer W212 was limited within 9700/cm$^2$ like in the surface of W22, but the density of BPDs of the surface of wafer W213 was increased to 22,000/cm$^2$, which is approximately twice that of the surface of W23. That is, it is presumed that, in wafer W212, the propagation of BPDs was obstructed by a unipolar APB of the laminated interface; on the other hand, in wafer W213, since an APB did not exist, BPDs of the surface of wafer W21 pierced W23 and reached the surface of the epitaxial growth layer.

Thus, the effect of the present invention has been verified.

In the present Example, a silicon carbide substrate with a relatively large density of defects was used as wafer W22; on the other hand, in the case where wafer W212 is manufactured by using a silicon carbide substrate with a low density of defects as wafer W22, even when the density of defects of the surface of wafer W21 is large, the propagation of these defects is blocked by an APB; thus, a silicon carbide laminated substrate with a low density of defects similar to the surface of wafer W22 can be obtained. As the silicon carbide substrate with a low density of defects, for example, a silicon carbide substrate with a low density of defects manufactured by a method described in JP-A 2003-119097 may be used.

Example 3

A compound semiconductor laminated substrate 50 having a unipolar antiphase boundary (an APB) shown in FIG. 6(e) and a laminated substrate not having a unipolar APB are manufactured, and the densities of basal plane dislocations (BPDs) of thin films that are homoepitaxially grown on the substrates are compared.

First, three kinds of single-crystal 4H-SiC substrates (wafers) were prepared. Each of two first wafers W31 serves as a support substrate portion of a laminated body (corresponding to the substrate 5b of FIG. 6), and is a wafer in which the (0001) Si-face is oriented in a direction inclined 4 degrees to the [11-20] orientation from the normal axis to the front surface. One second wafer W32 (corresponding to the substrate 5a of FIG. 6) is a wafer in which the (0001) Si-face is oriented in a direction inclined 4 degrees to the [-1-120] orientation from the normal axis to the front surface (a transfer substrate). One third wafer W33 (for comparison) is a wafer in which the (000-1) C-face is oriented in a direction inclined 4 degrees to the [-1-120] orientation from the normal axis to the front surface (a transfer substrate). The reason why a slightly inclined substrate is thus used is that it is attempted to achieve step control epitaxy in which the depositing order of crystal planes in the [0001] axis direction is propagated in the lateral direction to keep the polytype of the crystal (keep the atomic arrangement). Further, the reason why the direction of small inclination of the target plane is set opposite between wafer W31 and wafers W32 and W33 is that it is attempted to form a matched interface by suppressing the occurrence of a tilt angle grain boundary and a bipolar antiphase boundary when the surfaces are bonded together.

Each wafer was provided with a first orientation flat parallel to the [11-20] orientation and a second orientation flat parallel to the [1-100] orientation. The length of the first orientation flat was set to 38.5 mm, and the length of the second orientation flat was set to 18 mm. Wafer W31 was processed such that there was a relationship where, when the front surface was viewed, the first orientation flat was in the 6 o'clock direction of a clock and the second orientation flat was in the 3 o'clock direction of the clock. Wafers W32 and W33 were processed such that there was a relationship where, when the front surface was viewed, the first orientation flat was in the 6 o'clock direction of a clock and the second orientation flat was in the 9 o'clock direction of the clock. The thickness of each wafer is 0.5 mm.

Such wafers W31, W32, and W33 were simultaneously cleaned with a mixture solution of sulfuric acid and hydrogen peroxide water under the same treatment conditions (SPM cleaning), and then the oxide film of the surface was removed by dilute hydrofluoric acid treatment (HF treatment).

Next, homoepitaxial growth of 4H-SiC was performed on a surface of each of wafers W32 and W33 (FIG. 6(b)).

First, prior to epitaxial growth, wafers W32 and W33 were separately placed in an epitaxial growth apparatus, then hydrogen at 3 slm was introduced, and the temperature was increased to 1,600° C. under a pressure of 13 Pa. Upon a lapse of 10 minutes after the temperature reached 1,600° C., which lapse was in order to equalize the temperature in the epitaxial growth apparatus, $SiH_4$ gas and $C_3H_8$ gas were additionally introduced and epitaxial growth was started. At this time, the rates of flow of $SiH_4$ gas and $C_3H_8$ gas for wafer W32 were set to 10 sccm and 8 sccm, respectively, and the rates of flow of $SiH_4$ gas and $C_3H_8$ gas for wafer W33 were set to 8 sccm and 10 sccm, respectively. The reason why the rates of flow of gases are thus varied between wafers W32 and W33 is that the optimum conditions for promoting lateral growth from a slightly inclined plane vary in accordance with the difference between the polar faces of the surfaces (the Si-face and the C-face). The fact that the rate of growth of SiC based on each set of conditions was approximately 8 μm/h was found by temperature oscillation of a radiation thermometer that measures the temperature of the surface of the wafer (the measurement method is the same in Examples below).

In order that crystal defects exposed on the surface of the wafer might be prevented from propagating to the homoepitaxial growth layer, in the beginning of the epitaxial growth treatment mentioned above, nitrogen gas at 40 sccm was added into the gas mentioned above to modify a layer with a thickness of 1 μm formed in an earlier period of growth into a nitrogen-added layer with a nitrogen concentration of $1 \times 10^{18}$ atoms/$cm^3$, and thus a buffer layer (corresponding to the buffer layer 5c of FIG. 6(b)) was formed. At this time, basal plane dislocations (BPDs) propagating from the surface of the wafer to the epi-layer experience structure change into threading dislocations (TDs) in the buffer layer, and the density of BPDs of the surface is reduced.

Next, after the formation of the buffer layer with a thickness of 1 μm, the addition of nitrogen gas was stopped, and homoepitaxial growth of a thickness of 10 μm was performed. The fact that the homoepitaxial growth layer (corresponding to the homoepitaxial layer 5e of FIG. 6(b)) exhibited electrical conductivity of an n-type and the concentration of remaining carriers was $3 \times 10^{15}$/$cm^3$ was found by capacitance-voltage measurement (C-V measurement) performed later.

Various crystal defects are exposed on the surfaces before and after epitaxial growth; predominant defects are basal plane dislocations (BPDs) and threading dislocations (TDs). It was found that the density of BPDs of each of wafers W32 and W33 measured by molten KOH etching was 9,300 to 11,000/$cm^2$ before epitaxial growth (that is, also the density of BPDs in wafer W31 was the same); in contrast, both were reduced to 80 to 250/$cm^2$ after epitaxial growth.

On the other hand, in all the wafers, the density of TDs did not change between before and after epitaxial growth, and remained 800/$cm^2$.

Next, the surface of the epitaxial growth layer on each of wafers W32 and W33 was subjected to chemical mechanical polishing (CMP) treatment, and the arithmetic average roughness Ra of the surface was reduced from 1 nm to 0.2 nm. The reason why smoothing is thus performed is that it is attempted to reduce the area of the unbonded region in a wafer bonding process described later.

Next, the surface of the epitaxial growth layer on each of wafers W32 and W33 was provided with a vulnerable layer (corresponding to the ion implantation region $5_{ion}$ of FIG. 6(c)). This is treatment for transferring only the surface layer of each of wafers W32 and W33 onto wafer W31 after each of wafers W32 and W33 is brought into contact with and bonded to wafer W31. To this end, the surface of the epitaxial growth layer on each of wafers W32 and W33 was implanted with hydrogen ions to form the ion implantation region $5_{ion}$ shown in FIG. 6(c). The dose amount of hydrogen ions ($H^+$) implanted was set to $1.0 \times 10^{17}$ atoms/$cm^2$, and the ion acceleration energy was set to 65 keV so that the depth of the vulnerable layer might be 400 nm.

Then, wafers W31, W32, and W33 were simultaneously cleaned with a mixed acid of hydrogen peroxide water and sulfuric acid under the same treatment conditions (SPM cleaning), and then the oxide film of the surface was removed by dilute hydrofluoric acid treatment (HF treatment). Next, heat treatment at 700° C. was performed in a hydrogen atmosphere for 10 minutes to terminate the surface of the substrate with hydrogen, and the polarities of the substrates were equalized.

Next, a surface of each of wafers W32 and W33 was brought into contact with and bonded to a surface of wafer W31 (corresponding to the processing shown in FIG. 6(d)). Here, each surface of the wafer before contacting was irradiated with Ar plasma under the same treatment conditions, and was activated. Further, similarly to Example 1, affixing was performed while, using an L-shaped quartz jig, the orientation of the orientation flat of each of wafers W32 and W33 was made to coincide with the orientation of the orientation flat of wafer W31 (that is, in such a manner that the positions of the first orientation flats and the positions of the second orientation flats of the wafers coincided with each other accurately), and the deviation of the crystal plane in the [11-20] orientation was made less than or equal to 20 arcsec.

Thereby, the densities of mismatched interfaces (interfaces at which crystal lattices are discontinuous) between wafer W31 and wafer W32 and between wafer W31 and wafer W33 are reduced to a negligible level.

Here, attention is focused on the difference between the wafer W31/W32 interface and the wafer W31/W33 interface. At the interface between wafer W31 and wafer W32, Si polar faces face each other, and therefore Si—Si bonds exist. That is, a unipolar antiphase boundary (APB) of a monomolecular layer exists. On the other hand, at the interface between wafer W31 and wafer W33, a C polar face of wafer W33 faces a Si polar face of wafer W31. Hence, the interface is formed of Si—C bonds, and an APB does not exist at the interface.

Next, each of the bonded body of wafers W31 and W32 and the bonded body of wafers W31 and W33 was heated to 800° C. to cause breaking at the vulnerable layer formed by hydrogen ion implantation, and only a thin film layer with a thickness of 400 nm was allowed to remain (transferred) on the surface of wafer W31 (corresponding to the processing shown in FIG. 6(e)). The wafer in which a thin film layer on the wafer W32 side was transferred to the surface of wafer W31 by breaking is referred to as W312, and the wafer in which a thin film layer on the wafer W33 side was transferred to the surface of wafer W31 is referred to as W313. The arithmetic average roughness Ra of the surface of each of wafers W312 and W313 was increased to more than 1 nm due to the breaking processing, and thus CMP treatment was performed to reduce the arithmetic average roughness Ra of the surface to less than or equal to 0.2 nm.

Next, another round of homoepitaxial growth was performed on the surface of each of wafers W312 and W313. Prior to homoepitaxial growth, wafers W312 and W313 were separately placed in an epitaxial growth apparatus, then hydrogen at 3 slm was introduced, and the temperature was increased to 1,600° C. under a pressure of 13 Pa. Upon a lapse of 10 minutes after the temperature reached 1,600° C., which lapse was in order to equalize the temperature in the epitaxial growth apparatus, $SiH_4$ gas and $C_3H_8$ gas were additionally introduced and epitaxial growth was started. For wafer W313, similarly to the epitaxial growth on the wafer W32, the rates of flow of $SiH_4$ gas and $C_3H_8$ gas were set to 10 sccm and 8 sccm, respectively, because a Si-face was exposed on the surface; for wafer W312, similar to the wafer W33, the rates of flow of $SiH_4$ gas and $C_3H_8$ gas were set to 8 sccm and 10 sccm, respectively. Treatment for 75 minutes under these conditions was continued to perform homoepitaxial growth of 10 μm. The fact that the homoepitaxial growth layer exhibited electrical conductivity of an n-type and the concentration of remaining carriers was $3 \times 10^{15}/cm^3$ was found by C-V measurement performed later.

Next, in order to measure the density of defects of the surface of the epitaxial growth layer formed on each of wafers W312 and W313, potassium hydroxide was mounted on the surface and was melted by heating at 500° C. for 5 minutes, and thereby the etching of defects was promoted and noticeable-making treatment was performed. As a result of the measurement by molten KOH etching, it was found that the density of BPDs of the surface of wafer W312 was limited within 87 to 375/cm², which was substantially equal to that before epitaxial growth, but the density of BPDs of the surface of wafer W313 was increased to 8,700 to 15,000/cm² like in the surface of wafer W31 before epitaxial growth. That is, it is presumed that, in wafer W312, the propagation of BPDs was obstructed by a unipolar APB of the interface; on the other hand, in wafer W313, since an APB did not exist, BPDs of the surface of wafer W31 pierced also the buffer layer and reached the surface of the epitaxial growth layer.

Example 4

A laminated substrate was manufactured by exchanging the A-face and the B-face of the single-crystal substrate in Example 3 and using the substrate as a single-crystal substrate, and was evaluated.

First, three kinds of single-crystal 4H-SiC substrates (wafers) were prepared. Each of two first wafers W41 serves as a support substrate portion of a laminated body (corresponding to the substrate 5b of FIG. 6), and is a wafer in which the (000-1) C-face is oriented in a direction inclined 4 degrees to the [11-20] orientation from the normal axis to the front surface. One second wafer W42 (corresponding to the substrate 5a of FIG. 6) is a wafer in which the (000-1) C-face is oriented in a direction inclined 4 degrees to the [−1-120] orientation from the normal axis to the front surface. One third wafers W43 (for comparison) is a wafer in which the (0001) Si-face is oriented in a direction inclined 4 degrees to the [−1-120] orientation from the normal axis to the front surface. The reason why a slightly inclined substrate is thus used is that it is attempted to achieve step control epitaxy in which the depositing order of crystal planes in the [0001] axis direction is propagated in the lateral direction to keep the polytype of the crystal (keep the atomic arrangement). Further, the reason why the direction of small inclination of the target plane is set opposite between wafer W41 and wafers W42 and W43 is that it is attempted to form a matched interface by suppressing the occurrence of a tilt angle grain boundary when the surfaces are bonded together.

Each wafer was provided with a first orientation flat parallel to the [11-20] orientation and a second orientation flat parallel to the [1-100] orientation. The length of the first orientation flat was set to 38.5 mm, and the length of the second orientation flat was set to 18 mm. Wafer W41 was processed such that there was a relationship where, when the front surface was viewed, the first orientation flat was in the 6 o'clock direction of a clock and the second orientation flat was in the 3 o'clock direction of the clock. Wafers W42 and W43 were processed such that there was a relationship where, when the front surface was viewed, the first orientation flat was in the 6 o'clock direction of a clock and the second orientation flat was in the 9 o'clock direction of the clock. The thickness of each wafer is 0.5 mm.

Such wafers W41, W42, and W43 were simultaneously subjected to SPM cleaning under the same treatment conditions, and then the oxide film of the surface was removed by HF treatment.

Next, homoepitaxial growth of 4H-SiC was performed on a surface of each of wafers W42 and W43 (FIG. 6(b)).

First, prior to epitaxial growth, wafers W42 and W43 were separately placed in an epitaxial growth apparatus, then hydrogen at 3 slm was introduced, and the temperature was increased to 1,600° C. under a pressure of 13 Pa. Upon a lapse of 10 minutes after the temperature reached 1,600° C., which lapse was in order to equalize the temperature in the epitaxial growth apparatus, $SiH_4$ gas and $C_3H_8$ gas were additionally introduced and epitaxial growth was started. At this time, the rates of flow of $SiH_4$ gas and $C_3H_8$ gas for wafer W42 were set to 8 sccm and 10 sccm, respectively, and the rates of flow of $SiH_4$ gas and $C_3H_8$ gas for wafer W43 were set to 10 sccm and 8 sccm, respectively.

The rate of growth of SiC based on each set of conditions was approximately 8 μm/h.

In order that crystal defects exposed on the surface of the wafer might be prevented from propagating to the homoepitaxial growth layer, in the beginning of the epitaxial growth treatment mentioned above, nitrogen gas at 40 sccm was added into the gas mentioned above to modify a layer with a thickness of 1 μm formed in an earlier period of growth into a nitrogen-added layer with a nitrogen concentration of $1 \times 10^{18}$ atoms/cm$^3$, and thus a buffer layer (corresponding to the buffer layer 5c of FIG. 6(b)) was formed.

Next, after the formation of the buffer layer with a thickness of 1 μm, the addition of nitrogen gas was stopped, and homoepitaxial growth of a thickness of 10 μm was performed. The fact that the homoepitaxial growth layer (corresponding to the homoepitaxial layer 5e of FIG. 6(b)) exhibited electrical conductivity of an n-type and the concentration of remaining carriers was $3 \times 10^{15}$/cm$^3$ was found by capacitance-voltage measurement (C-V measurement) performed later.

Here, it was found that the density of BPDs of each of wafers W42 and W43 measured by 500° C. molten KOH etching was 9,300 to 11,000/cm$^2$ before epitaxial growth; in contrast, both were reduced to 35 to 140/cm$^2$ after epitaxial growth. On the other hand, the density of TDs did not change between before and after epitaxial growth in any of the wafers, and remained 800/cm$^2$.

Next, the surface of the epitaxial growth layer on each of wafers W42 and W43 was subjected to CMP treatment, and the arithmetic average roughness (Ra) of the surface was reduced from 1 nm to 0.2 nm.

Next, the surface of the epitaxial growth layer of each of wafers W42 and W43 was provided with a vulnerable layer (corresponding to the ion implantation region $5_{ion}$ of FIG. 6(c)). That is, the surface of the epitaxial growth layer of each of wafers W42 and W43 was implanted with hydrogen ions to form the ion implantation region $5_{ion}$ shown in FIG. 6(c). The dose amount of hydrogen ions (H$^+$) implanted was set to $1.0 \times 10^{17}$ atoms/cm$^2$, and the ion acceleration energy was set to 65 keV so that the depth of the vulnerable layer might be 400 nm.

Then, wafers W41, W42, and W43 were simultaneously cleaned with a mixed acid of hydrogen peroxide water and sulfuric acid under the same treatment conditions (SPM cleaning), and then the oxide film of the surface was removed by dilute hydrofluoric acid treatment (HF treatment). Next, heat treatment at 700° C. was performed in a hydrogen atmosphere for 10 minutes to terminate the surface of the substrate with hydrogen, and the polarities of the substrates were equalized.

Next, a surface of each of wafers W42 and W43 was brought into contact with and bonded to a surface of wafer W41 (corresponding to the processing shown in FIG. 6(d)). Here, each surface of the wafer before contacting was irradiated with Ar plasma under the same treatment conditions, and was activated. Further, similarly to Example 1, affixing was performed while, using an L-shaped quartz jig, the orientation of the orientation flat of each of wafers W42 and W43 was made to coincide with the orientation of the orientation flat of wafer W41 (that is, in such a manner that the positions of the first orientation flats and the positions of the second orientation flats of the wafers coincided with each other accurately), and the deviation of the crystal plane in the [11-20] orientation was made less than or equal to 20 arcsec.

Thereby, the densities of mismatched interfaces (interfaces at which crystal lattices are discontinuous) between wafer W41 and wafer W42 and between wafer W41 and wafer W43 are reduced to a negligible level.

Here, attention is focused on the difference between the wafer W41/W42 interface and the wafer W41/W43 interface. At the interface between wafer W41 and wafer W42, C polar faces face each other, and therefore C—C bonds exist. That is, a unipolar antiphase boundary (APB) of a monomolecular layer exists. On the other hand, at the interface between wafer W41 and wafer W43, a Si polar face of wafer W43 faces a C polar face of wafer W41. Hence, the interface is formed of Si—C bonds, and an APB does not exist at the interface.

Next, each of the bonded body of wafers W41 and W42 and the bonded body of wafers W41 and W43 was heated to 800° C. to cause breaking at the vulnerable layer formed by hydrogen ion implantation, and only a thin film layer with a thickness of 400 nm was allowed to remain (transferred) on the surface of wafer W41 (corresponding to the processing shown in FIG. 6(e)). The wafer in which a thin film layer on the wafer W42 side was transferred to the surface of wafer W41 by breaking is referred to as W412, and the wafer in which a thin film layer on the wafer W43 side was transferred to the surface of wafer W41 is referred to as W413. The arithmetic average roughness Ra of the surface of each of wafers W412 and W413 was increased to more than 1 nm due to the breaking processing, and thus CMP treatment was performed to reduce the arithmetic average roughness Ra of the surface to less than or equal to 0.2 nm.

Next, another round of homoepitaxial growth was performed on the surface of each of wafers W412 and W413. Prior to homoepitaxial growth, wafers W412 and W413 were separately placed in an epitaxial growth apparatus, then hydrogen at 3 slm was introduced, and the temperature was increased to 1,600° C. under a pressure of 13 Pa. Upon a lapse of 10 minutes after the temperature reached 1,600° C., which lapse was in order to equalize the temperature in the epitaxial growth apparatus, $SiH_4$ gas and $C_3H_8$ gas were additionally introduced and epitaxial growth was started. For wafer W413, similarly to the epitaxial growth on the wafer W42, the rates of flow of $SiH_4$ gas and $C_3H_8$ gas were set to 8 sccm and 10 sccm, respectively, because a C-face was exposed on the surface; for wafer W412, similarly to the wafer W43, the rates of flow of $SiH_4$ gas and $C_3H_8$ gas were set to 10 sccm and 8 sccm, respectively. Treatment for 75 minutes under these conditions was continued to perform homoepitaxial growth of 10 μm. The fact that the homoepitaxial growth layer exhibited electrical conductivity of an n-type and the concentration of remaining carriers was $3\times10^{15}/cm^3$ was found by C-V measurement performed later.

Next, in order to measure the density of defects of the surface of the epitaxial growth layer formed on each of wafers W412 and W413, potassium hydroxide was mounted on the surface and was melted by heating at 500° C. for 5 minutes, and thereby the etching of defects was promoted to make the defects visible. As a result of the measurement by molten KOH etching, it was found that the density of BPDs of the surface of wafer W412 was limited within 84 to $184/cm^2$, which was substantially equal to that before epitaxial growth, but the density of BPDs of the surface of wafer W413 was increased to 9,200 to $15,000/cm^2$ like in the surface of wafer W41 before epitaxial growth. That is, it is presumed that, in wafer W412, the propagation of BPDs was obstructed by a unipolar APB of the interface; on the other hand, in wafer W413, since an APB did not exist, BPDs of the surface of wafer W41 pierced also the buffer layer and reached the surface of the epitaxial growth layer.

Example 5

A laminated substrate was manufactured by changing the single-crystal substrate to one different in crystal structure (the arrangement of the crystal) in Example 3, and was evaluated.

First, three kinds of single-crystal 6H-SiC substrates (wafers) were prepared. Each of two first wafers W51 serves as a support substrate portion of a laminated body (corresponding to the substrate 5b of FIG. 6), and is a wafer in which the (0001) Si-face is oriented in a direction inclined 4 degrees to the [11-20] orientation from the normal axis to the front surface. One second wafer W52 (corresponding to the substrate 5a of FIG. 6) is a wafer in which the (0001) Si-face is oriented in a direction inclined 4 degrees to the [−1-120] orientation from the normal axis to the front surface. One third wafer W53 (for comparison) is a wafer in which the (000-1) C-face is oriented in a direction inclined 4 degrees to the [−1-120] orientation from the normal axis to the front surface.

Each wafer was provided with a first orientation flat parallel to the [11-20] orientation and a second orientation flat parallel to the [1-100] orientation. The length of the first orientation flat was set to 38.5 mm, and the length of the second orientation flat was set to 18 mm. Wafer W51 was processed such that there was a relationship where, when the front surface was viewed, the first orientation flat was in the 6 o'clock direction of a clock and the second orientation flat was in the 3 o'clock direction of the clock. Wafers W52 and W53 were processed such that there was a relationship where, when the front surface was viewed, the first orientation flat was in the 6 o'clock direction of a clock and the second orientation flat was in the 9 o'clock direction of the clock. The thickness of each wafer is 0.5 mm.

Such wafers W51, W52, and W53 were simultaneously subjected to SPM cleaning under the same treatment conditions, and then the oxide film of the surface was removed by HF treatment.

Next, homoepitaxial growth of 6H-SiC was performed on a surface of each of wafers W52 and W53 (FIG. 6(b)).

First, prior to epitaxial growth, wafers W52 and W53 were separately placed in an epitaxial growth apparatus, then hydrogen at 3 slm was introduced, and the temperature was increased to 1,550° C. under a pressure of 13 Pa. Upon a lapse of 10 minutes after the temperature reached 1,550° C., which lapse was in order to equalize the temperature in the epitaxial growth apparatus, $SiH_4$ gas and $C_3H_8$ gas were additionally introduced and epitaxial growth was started. At this time, the rates of flow of $SiH_4$ gas and $C_3H_8$ gas for wafer W52 were set to 10 sccm and 8 sccm, respectively, and the rates of flow of $SiH_4$ gas and $C_3H_8$ gas for wafer W53 were set to 8 sccm and 10 sccm, respectively.

The rate of growth of SiC based on each set of conditions was approximately 8 μm/h.

In order that crystal defects exposed on the surface of the wafer might be prevented from propagating to the homoepitaxial growth layer, in the beginning of the epitaxial growth treatment mentioned above, nitrogen gas at 40 sccm was added into the gas mentioned above to modify a layer with a thickness of 1 μm formed in an earlier period of growth into a nitrogen-added layer with a nitrogen concentration of $1\times10^{18}$ atoms/cm³, and thus a buffer layer (corresponding to the buffer layer 5c of FIG. 6(b)) was formed.

Next, after the formation of the buffer layer with a thickness of 1 μm, the addition of nitrogen gas was stopped, and homoepitaxial growth of a thickness of 10 μm was performed. The fact that the homoepitaxial growth layer (corresponding to the homoepitaxial layer 5e of FIG. 6(b)) exhibited electrical conductivity of an n-type and the concentration of remaining carriers was $3\times10^{15}/cm^3$ was found by capacitance-voltage measurement (C-V measurement) performed later.

Here, it was found that the density of BPDs of each of wafers W52 and W53 measured by 500° C. molten KOH etching was 8,700 to $12,000/cm^2$ before epitaxial growth; in contrast, both were reduced to 38 to $260/cm^2$ after epitaxial growth. On the other hand, the density of TDs did not change between before and after epitaxial growth in any of the wafers, and remained $300/cm^2$.

Next, the surface of the epitaxial growth layer on each of wafers W52 and W53 was subjected to CMP treatment, and the arithmetic average roughness (Ra) of the surface was reduced from 1 nm to 0.2 nm.

Next, the surface of the epitaxial growth layer of each of wafers W52 and W53 was provided with a vulnerable layer (corresponding to the ion implantation region $5_{ion}$ of FIG. 6(c)). That is, the surface of the epitaxial growth layer of each of wafers W52 and W53 was implanted with hydrogen ions to form the ion implantation region $5_{ion}$ shown in FIG. 6(c). The dose amount of hydrogen ions ($H^+$) implanted was set to $1.0\times10^{17}$ atoms/cm², and the ion acceleration energy was set to 65 keV so that the depth of the vulnerable layer might be 400 nm.

Then, wafers W51, W52, and W53 were simultaneously cleaned with a mixed acid of hydrogen peroxide water and sulfuric acid under the same treatment conditions (SPM cleaning), and then the oxide film of the surface was removed by dilute hydrofluoric acid treatment (HF treatment). Next, heat treatment at 700° C. was performed in a hydrogen atmosphere for 10 minutes to terminate the surface of the substrate with hydrogen, and the polarities of the substrates were equalized.

Next, a surface of each of wafers W52 and W53 was brought into contact with and bonded to a surface of wafer W51 (corresponding to the processing shown in FIG. 6(d)). Here, each surface of the wafer before contacting was irradiated with Ar plasma under the same treatment conditions, and was activated. Further, similarly to Example 1, affixing was performed while, using an L-shaped quartz jig, the orientation of the orientation flat of each of wafers W52 and W53 was made to coincide with the orientation of the orientation flat of wafer W51 (that is, in such a manner that the positions of the first orientation flats and the positions of the second orientation flats of the wafers coincided with each other accurately), and the deviation of the crystal plane in the [11-20] orientation was made less than or equal to 20 arcsec.

Here, attention is focused on the difference between the wafer W51/W52 interface and the wafer W51/W53 interface. At the interface between wafer W51 and wafer W52, Si polar faces face each other, and therefore Si—Si bonds exist. That is, a unipolar antiphase boundary (APB) of a monomolecular layer exists. On the other hand, at the interface between wafer W51 and wafer W53, a C polar face of wafer W53 faces a Si polar face of wafer W51. Hence, the interface is formed of Si—C bonds, and an APB does not exist at the interface.

Next, each of the bonded body of wafers W51 and W52 and the bonded body of wafers W51 and W53 was heated to 800° C. to cause breaking at the vulnerable layer formed by hydrogen ion implantation, and only a thin film layer with a thickness of 400 nm was allowed to remain (transferred) on the surface of wafer W51 (corresponding to the processing shown in FIG. 6(e)). The wafer in which a thin film layer on the wafer W52 side was transferred to the surface of wafer W51 by breaking is referred to as W512, and the wafer in which a thin film layer on the wafer W53 side was transferred to the surface of wafer W51 is referred to as W513. The arithmetic average roughness Ra of the surface of each of wafers W512 and W513 was increased to more than 1 nm due to the breaking processing, and thus CMP treatment was performed to reduce the arithmetic average roughness Ra of the surface to less than or equal to 0.2 nm.

Next, another round of homoepitaxial growth was performed on the surface of each of wafers W512 and W513. Prior to homoepitaxial growth, wafers W512 and W513 were separately placed in an epitaxial growth apparatus, then hydrogen at 3 slm was introduced, and the temperature was increased to 1,550° C. under a pressure of 13 Pa. Upon a lapse of 10 minutes after the temperature reached 1,550° C., which lapse was in order to equalize the temperature in the epitaxial growth apparatus, $SiH_4$ gas and $C_3H_8$ gas were additionally introduced and epitaxial growth was started. For wafer W513, similarly to the epitaxial growth on the wafer W52, the rates of flow of $SiH_4$ gas and $C_3H_8$ gas were set to 10 sccm to and 8 sccm, respectively, because a Si-face was exposed on the surface; for wafer W512, similarly to the wafer W53, the rates of flow of $SiH_4$ gas and $C_3H_8$ gas were set to 8 sccm and 10 sccm, respectively. Treatment for 75 minutes under these conditions was continued to perform homoepitaxial growth of 10 μm. The fact that the homoepitaxial growth layer exhibited electrical conductivity of an n-type and the concentration of remaining carriers was $3 \times 10^{15}/cm^3$ was found by C-V measurement performed later.

Next, in order to measure the density of defects of the surface of the epitaxial growth layer formed on each of wafers W512 and W513, potassium hydroxide was mounted on the surface and was melted by heating at 500° C. for 5 minutes, and thereby the etching of defects was promoted and noticeable-making treatment was performed. As a result of the measurement by molten KOH etching, it was found that the density of BPDs of the surface of wafer W512 was limited within 42 to 292/cm², which was substantially equal to that before epitaxial growth, but the density of BPDs of the surface of wafer W513 was increased to 1,400 to 18,000/cm² like in the surface of wafer W51 before epitaxial growth. That is, it is presumed that, in wafer W512, the propagation of BPDs was obstructed by a unipolar APB of the interface; on the other hand, in wafer W513, since an APB did not exist, BPDs of the surface of wafer W31 pierced also the buffer layer and reached the surface of the epitaxial growth layer.

Example 6

A laminated substrate was manufactured by exchanging the A-face and the B-face of the single-crystal substrate in Example 5 and using the substrate as a single-crystal substrate, and was evaluated.

First, three kinds of single-crystal 6H-SiC substrates (wafers) were prepared. Each of two first wafers W61 serves as a support substrate portion of a laminated body (corresponding to the substrate 5b of FIG. 6), and is a wafer in which the (000-1) C-face is oriented in a direction inclined 4 degrees to the [11-20] orientation from the normal axis to the front surface. One second wafer W62 (corresponding to the substrate 5a of FIG. 6) is a wafer in which the (000-1) C-face is oriented in a direction inclined 4 degrees to the [-1-120] orientation from the normal axis to the front surface. One third wafer W63 (for comparison) is a wafer in which the (0001) Si-face is oriented in a direction inclined 4 degrees to the [-1-120] orientation from the normal axis to the front surface.

Each wafer was provided with a first orientation flat parallel to the [11-20] orientation and a second orientation flat parallel to the [1-100] orientation. The length of the first orientation flat was set to 38.5 mm, and the length of the second orientation flat was set to 18 mm. Wafer W61 was processed such that there was a relationship where, when the front surface was viewed, the first orientation flat was in the 6 o'clock direction of a clock and the second orientation flat was in the 3 o'clock direction of the clock. Wafers W62 and W63 were processed such that there was a relationship where, when the front surface was viewed, the first orientation flat was in the 6 o'clock direction of a clock and the second orientation flat was in the 9 o'clock direction of the clock. The thickness of each wafer is 0.5 mm.

Such wafers W61, W62, and W63 were simultaneously subjected to SPM cleaning under the same treatment conditions, and then the oxide film of the surface was removed by HF treatment.

Next, homoepitaxial growth of 6H-SiC was performed on a surface of each of wafers W62 and W63 (FIG. 6(b)).

First, prior to epitaxial growth, wafers W62 and W63 were separately placed in an epitaxial growth apparatus, then hydrogen at 3 slm was introduced, and the temperature was increased to 1,550° C. under a pressure of 13 Pa. Upon a lapse of 10 minutes after the temperature reached 1,550° C., which lapse was in order to equalize the temperature in the epitaxial growth apparatus, $SiH_4$ gas and $C_3H_8$ gas were additionally introduced and epitaxial growth was started. At this time, the rates of flow of $SiH_4$ gas and $C_3H_8$ gas for wafer W62 were set to 8 sccm and 10 sccm, respectively, and the rates of flow of $SiH_4$ gas and $C_3H_8$ gas for wafer W63 were set to 10 sccm and 8 sccm, respectively.

The rate of growth of SiC based on each set of conditions was approximately 8 μm/h.

In order that crystal defects exposed on the surface of the wafer might be prevented to from propagating to the homoepitaxial growth layer, in the beginning of the epitaxial growth treatment mentioned above, nitrogen gas at 40 sccm was added into the gas mentioned above to modify a layer with a thickness of 1 μm formed in an earlier period of growth into a nitrogen-added layer with a nitrogen concentration of $1 \times 10^{18}$ atoms/cm$^3$, and thus a buffer layer (corresponding to the buffer layer 5c of FIG. 6(b)) was formed.

Next, after the formation of the buffer layer with a thickness of 1 μm, the addition of nitrogen gas was stopped, and homoepitaxial growth of a thickness of 10 μm was performed. The fact that the homoepitaxial growth layer (corresponding to the homoepitaxial layer 5e of FIG. 6(b)) exhibited electrical conductivity of an n-type and the concentration of remaining carriers was $3 \times 10^{15}$/cm$^3$ was found by capacitance-voltage measurement (C-V measurement) performed later.

Here, it was found that the density of BPDs of each of wafers W62 and W63 measured by 500° C. molten KOH etching was 8,700 to 12,000/cm$^2$ before epitaxial growth; in contrast, both were reduced to 29 to 84/cm$^2$ after epitaxial growth. On the other hand, the density of TDs did not change between before and after epitaxial growth in any of the wafers, and remained 300/cm$^2$.

Next, the surface of the epitaxial growth layer on each of wafers W62 and W63 was subjected to CMP treatment, and the arithmetic average roughness (Ra) of the surface was reduced from 1 nm to 0.2 nm.

Next, the surface of the epitaxial growth layer of each of wafers W62 and W63 was provided with a vulnerable layer (corresponding to the ion implantation region $5_{ion}$ of FIG. 6(c)). That is, the surface of the epitaxial growth layer of each of wafers W62 and W63 was implanted with hydrogen ions to form the ion implantation region $5_{ion}$ shown in FIG. 6(c). The dose amount of hydrogen ions (H$^+$) implanted was set to $1.0 \times 10^{17}$ atoms/cm$^2$, and the ion acceleration energy was set to 65 keV so that the depth of the vulnerable layer might be 400 nm.

Then, wafers W61, W62, and W63 were simultaneously cleaned with a mixed acid of hydrogen peroxide water and sulfuric acid under the same treatment conditions (SPM cleaning), and then the oxide film of the surface was removed by dilute hydrofluoric acid treatment (HF treatment). Next, heat treatment at 700° C. was performed in a hydrogen atmosphere for 10 minutes to terminate the surface of the substrate with hydrogen, and the polarities of the substrates were equalized.

Next, a surface of each of wafers W62 and W63 was brought into contact with and bonded to a surface of wafer W61 (corresponding to the processing shown in FIG. 6(d)). Here, each surface of the wafer before contacting was irradiated with Ar plasma under the same treatment conditions, and was activated. Further, similarly to Example 1, affixing was performed while, using an L-shaped quartz jig, the orientation of the orientation flat of each of wafers W62 and W63 was made to coincide with the orientation of the orientation flat of wafer W61 (that is, in such a manner that the positions of the first orientation flats and the positions of the second orientation flats of the wafers coincided with each other accurately), and the deviation of the crystal plane in the [11-20] orientation was made less than or equal to 20 arcsec.

Thereby, the densities of mismatched interfaces (interfaces at which crystal lattices are discontinuous) between wafer W61 and wafer W62 and between wafer W61 and wafer W63 are reduced to a negligible level.

Here, attention is focused on the difference between the wafer W61/W62 interface and the wafer W61/W63 interface. At the interface between wafer W61 and wafer W62, C polar faces face each other, and therefore C—C bonds exist. That is, a unipolar antiphase boundary (APB) of a monomolecular layer exists. On the other hand, at the interface between wafer W61 and wafer W63, a Si polar face of wafer W63 faces a C polar face of wafer W61. Hence, the interface is formed of Si—C bonds, and an APB does not exist at the interface.

Next, each of the bonded body of wafers W61 and W62 and the bonded body of wafers W61 and W63 was heated to 800° C. to cause breaking at the vulnerable layer formed by hydrogen ion implantation, and only a thin film layer with a thickness of 400 nm was allowed to remain (transferred) on the surface of wafer W61 (corresponding to the processing shown in FIG. 6(e)). The wafer in which a thin film layer on the wafer W62 side was transferred to the surface of wafer W61 by breaking is referred to as W612, and the wafer in which a thin film layer on the wafer W63 side was transferred to the surface of wafer W61 is referred to as W613. The arithmetic average roughness Ra of the surface of each of wafers W612 and W613 was increased to more than 1 nm due to the breaking processing, and thus CMP treatment was performed to reduce the arithmetic average roughness Ra of the surface to less than or equal to 0.2 nm.

Next, another round of homoepitaxial growth was performed on the surface of each of wafers W612 and W613. Prior to homoepitaxial growth, wafers W612 and W613 were separately placed in an epitaxial growth apparatus, then hydrogen at 3 slm was introduced, and the temperature was increased to 1,550° C. under a pressure of 13 Pa. Upon a lapse of 10 minutes after the temperature reached 1,550° C., which lapse was in order to equalize the temperature in the epitaxial growth apparatus, SiH$_4$ gas and C$_3$H$_8$ gas were additionally introduced and epitaxial growth was started. For wafer W613, similarly to the epitaxial growth on the wafer W62, the rates of flow of SiH$_4$ gas and C$_3$H$_8$ gas were set to 8 sccm and 10 sccm, respectively, because a C-face was exposed on the surface; for wafer W612, similarly to the wafer W63, the rates of flow of SiH$_4$ gas and C$_3$H$_8$ gas were set to 10 sccm and 8 sccm, respectively. Treatment for 75 minutes under these conditions was continued to perform homoepitaxial growth of 10 μm. The fact that the homoepitaxial growth layer exhibited electrical conductivity of an n-type and the concentration of remaining carriers was $3 \times 10^{15}$/cm$^3$ was found by C-V measurement performed later.

Next, in order to measure the density of defects of the surface of the epitaxial growth layer formed on each of wafers W612 and W613, potassium hydroxide was mounted on the surface and was melted by heating at 500° C. for 5 minutes, and thereby the etching of defects was promoted and noticeable-making treatment was performed. As a result of the measurement by molten KOH etching, it was found that the density of BPDs of the surface of wafer W612 was limited within 31 to 94/cm$^2$, which was substantially equal to that before epitaxial growth, but the density of BPDs of the surface of wafer W613 was increased to 312 to 824/cm$^2$ like in the surface of wafer W61 before epitaxial growth. That is, it is presumed that, in wafer W612, the propagation of BPDs was obstructed by a unipolar APB of the interface; on the other hand, in wafer W613, since an APB did not exist, BPDs of the surface of wafer W61 pierced also the buffer layer and reached the surface of the epitaxial growth layer.

Example 7

A laminated substrate was manufactured by changing the single-crystal substrate to one different in crystal structure (crystal polymorphism) in Example 3, and was evaluated.

First, three kinds of single-crystal 3C-SiC substrates (wafers) were prepared. Each of two first wafers W71 serves as a support substrate portion of a laminated body (corresponding to the substrate 5b of FIG. 6), and each has a (111) Si-face as a surface. Also one second wafer W72 (corresponding to the substrate 5a of FIG. 6) has a (111) Si-face as a surface. One third wafer W73 (for comparison) has a (−1−1−1) C-face as a surface.

Each wafer was provided with a first orientation flat parallel to the [110] orientation and a second orientation flat parallel to the [1-10] orientation. The length of the first orientation flat was set to 38.5 mm, and the length of the second orientation flat was set to 18 mm. Wafer W71 was processed such that there was a relationship where, when the front surface was viewed, the first orientation flat was in the 6 o'clock direction of a clock and the second orientation flat was in the 3 o'clock direction of the clock. Wafers W72 and W73 were processed such that there was a relationship where, when the front surface was viewed, the first orientation flat was in the 6 o'clock direction of a clock and the second orientation flat was in the 9 o'clock direction of the clock. The thickness of each wafer is 0.5 mm.

Such wafers W71, W72, and W73 were simultaneously subjected to SPM cleaning under the same treatment conditions, and then the oxide film of the surface was removed by HF treatment.

Next, homoepitaxial growth of 3C-SiC was performed on a surface of each of wafers W72 and W73 (FIG. 6(b)).

First, prior to epitaxial growth, wafers W72 and W73 were separately placed in an epitaxial growth apparatus, then hydrogen at 500 sccm was introduced, and the temperature was increased to 1,350° C. under a pressure of 1 Pa. Upon a lapse of 10 minutes after the temperature reached 1,350° C., which lapse was in order to equalize the temperature in the epitaxial growth apparatus, $SiH_2Cl_2$ gas and $C_2H_2$ gas were additionally introduced and epitaxial growth was started. At this time, the rates of flow of $SiH_2Cl_2$ gas and $C_2H_2$ gas for wafer W72 were set to 50 sccm and 12 sccm, respectively, and the rates of flow of $SiH_2Cl_2$ gas and $C_2H_2$ gas for wafer W73 were set to 50 sccm and 14 sccm, respectively. The reason why the rate of flow of $C_2H_2$ gas is thus varied between wafers W72 and W73 is that the degree of supersaturation of the surface varies and the optimum epitaxial growth conditions vary in accordance with the difference between the polar faces of the surfaces (the Si-face and the C-face).

The rate of growth of SiC based on each set of conditions was approximately 21 µm/h.

This homoepitaxial growth was performed for 29 minutes, and a homoepitaxial growth layer with a thickness of 10 µm was obtained. The homoepitaxial growth layer 5e of FIG. 6(b)) exhibited electrical conductivity of an n-type and the concentration of remaining carriers was $2\times10^{16}/cm^3$ was found by capacitance-voltage measurement (C-V measurement) performed later.

Here, stacking faults (SFs) of the surface of the epitaxial growth layer of each of wafers W72 and W73 were made noticeable by 500° C. molten KOH etching; consequently, it was found that the density of SFs of each epitaxial growth layer was 368 to 890/cm².

Next, the surface of the epitaxial growth layer on each of wafers W72 and W73 was subjected to CMP treatment, and the arithmetic average roughness (Ra) of the surface was reduced from 1 nm to 0.2 nm.

Next, the surface of the epitaxial growth layer of each of wafers W72 and W73 was provided with a vulnerable layer (corresponding to the ion implantation region $5_{ion}$ of FIG. 6(c)). That is, the surface of the epitaxial growth layer of each of wafers W72 and W73 was implanted with hydrogen ions to form the ion implantation region $5_{ion}$ shown in FIG. 6(c). The dose amount of hydrogen ions ($H^+$) implanted was set to $1.0\times10^{17}$ atoms/cm², and the ion acceleration energy was set to 65 keV so that the depth of the vulnerable layer might be 400 nm.

Then, wafers W71, W72, and W73 were simultaneously cleaned with a mixed acid of hydrogen peroxide water and sulfuric acid under the same treatment conditions (SPM cleaning), and then the oxide film of the surface was removed by dilute hydrofluoric acid treatment (HF treatment). Next, heat treatment at 700° C. was performed in a hydrogen atmosphere for 10 minutes to terminate the surface of the substrate with hydrogen, and the polarities of the substrates were equalized.

Next, a surface of each of wafers W72 and W73 was brought into contact with and bonded to a surface of wafer W71 (corresponding to the processing shown in FIG. 6(d)). Here, each surface of the wafer before contacting was irradiated with Ar plasma, and was activated. Further, similarly to Example 1, affixing was performed while, using an L-shaped quartz jig, the orientation of the orientation flat of each of wafers W72 and W73 was made to coincide with the orientation of the orientation flat of wafer W71 (that is, in such a manner that the positions of the first orientation flats and the positions of the second orientation flats of the wafers coincided with each other accurately), and the deviation of the crystal plane in the [110] orientation was made less than or equal to 20 arcsec.

Thereby, the densities of mismatched interfaces between wafers W71 and W72 and between wafers W71 and W73 are reduced to a negligible level.

Here, attention is focused on the difference between the wafer W71/W72 interface and the wafer W71/W73 interface. At the interface between wafer W71 and wafer W72, Si polar faces face each other, and therefore Si—Si bonds exist. That is, a unipolar antiphase boundary (APB) of a monomolecular layer exists. On the other hand, at the interface between wafer W71 and wafer W73, a C polar face of wafer W73 faces a Si polar face of wafer W71. Hence, the interface is formed of Si—C bonds, and an APB does not exist at the interface.

Next, each of the bonded body of wafers W71 and W72 and the bonded body of wafers W71 and W73 was heated to 800° C. to cause breaking at the vulnerable layer formed by hydrogen ion implantation, and only a thin film layer with a thickness of 400 nm was allowed to remain (transferred) on the surface of wafer W71 (corresponding to the processing shown in FIG. 6(e)). The wafer in which a thin film layer on the wafer W72 side was transferred to the surface of wafer W71 by breaking is referred to as W712, and the wafer in which a thin film layer on the wafer W73 side was transferred to the surface of wafer W71 is referred to as W713. The arithmetic average roughness Ra of the surface of each of wafers W712 and W713 was increased to more than 1 nm due to the breaking processing, and thus CMP treatment was performed to reduce the arithmetic average roughness Ra of the surface to less than or equal to 0.2 nm.

Next, another round of homoepitaxial growth was performed on the surface of each of wafers W712 and W713. Prior to homoepitaxial growth, wafers W712 and W713 were separately placed in an epitaxial growth apparatus, then hydrogen at 500 sccm was introduced, and the temperature was increased to 1,350° C. under a pressure of 1 Pa. Upon a lapse of 10 minutes after the temperature reached 1,350° C., which lapse was in order to equalize the temperature in the epitaxial growth apparatus, $SiH_2Cl_2$ gas and $C_2H_2$ gas were additionally introduced and epitaxial growth was started. At this time, the rates of flow of $SiH_2Cl_2$ gas and $C_2H_2$ gas for wafer W712 were set to 50 sccm and 14 sccm, respectively, and the rates of flow of $SiH_2Cl_2$ gas and $C_2H_2$ gas for wafer W713 were set to 50 sccm and 12 sccm, respectively. Treatment for 29 minutes under these conditions was continued to perform homoepitaxial growth of 10 μm. The fact that the homoepitaxial growth layer exhibited electrical conductivity of an n-type and the concentration of remaining carriers was $2×10^{16}/cm^3$ was found by C-V measurement performed later.

Next, in order to measure the density of defects of the surface of the epitaxial growth layer formed on each of wafers W712 and W713, potassium hydroxide was mounted on the surface and was melted by heating at 500° C. for 5 minutes, and thereby the etching of defects was promoted and noticeable-making treatment was performed. As a result of the measurement by molten KOH etching, it was found that the density of SFs of the surface of wafer W712 was limited within 456 to 917/cm², which is substantially equal to that before epitaxial growth, but the density of SFs of the surface of wafer W713 was increased to 16,000 to 23,000/cm². That is, it is presumed that, in wafer W712, the propagation of SFs was obstructed by a unipolar APB of the interface; on the other hand, in wafer W713, since an APB did not exist, SFs of the surface of wafer W71 reached the surface of the epitaxial growth layer.

Example 8

A laminated substrate was manufactured by exchanging the A-face and the B-face of the single-crystal substrate in Example 7 and using the substrate as a single-crystal substrate, and was evaluated.

First, three kinds of single-crystal 3C-SiC substrates (wafers) were prepared. Each of two first wafers W81 serves as a support substrate portion of a laminated body (corresponding to the substrate 5b of FIG. 6), and each has a (−1−1−1) C-face as a surface. Also one second wafer W82 (corresponding to the substrate 5a of FIG. 6) has a (−1−1−1) C-face as a surface. One third wafer W83 (for comparison) has a (111) Si-face as a surface.

Each wafer was provided with a first orientation flat parallel to the [110] orientation and a second orientation flat parallel to the [1-10] orientation. The length of the first orientation flat was set to 38.5 mm, and the length of the second orientation flat was set to 18 mm. Wafer W81 was processed such that there was a relationship where, when the front surface was viewed, the first orientation flat was in the 6 o'clock direction of a clock and the second orientation flat was in the 3 o'clock direction of the clock. Wafers W82 and W83 were processed such that there was a relationship where, when the front surface was viewed, the first orientation flat was in the 6 o'clock direction of a clock and the second orientation flat was in the 9 o'clock direction of the clock. The thickness of each wafer is 0.5 mm.

Such wafers W81, W82, and W83 were simultaneously subjected to SPM cleaning under the same treatment conditions, and then the oxide film of the surface was removed by HF treatment.

Next, homoepitaxial growth of 3C-SiC was performed on a surface of each of wafers W82 and W83 (FIG. 6(b)).

First, prior to epitaxial growth, wafers W82 and W83 were separately placed in an epitaxial growth apparatus, then hydrogen at 500 sccm was introduced, and the temperature was increased to 1,350° C. under a pressure of 1 Pa. Upon a lapse of 10 minutes after the temperature reached 1,350° C., which lapse was in order to equalize the temperature in the epitaxial growth apparatus, $SiH_2Cl_2$ gas and $C_2H_2$ gas were additionally introduced and epitaxial growth was started. At this time, the rates of flow of $SiH_2Cl_2$ gas and $C_2H_2$ gas for wafer W82 were set to 50 sccm and 14 sccm, respectively, and the rates of flow of $SiH_2Cl_2$ gas and $C_2H_2$ gas for wafer W83 were set to 50 sccm and 12 sccm, respectively.

The rate of growth of SiC based on each set of conditions was approximately 21 μm/h.

This homoepitaxial growth was performed for 29 minutes, and a homoepitaxial growth layer with a thickness of 10 μm was obtained. The homoepitaxial growth layer 5e of FIG. 6(b)) exhibited electrical conductivity of an n-type and the concentration of remaining carriers was $2×10^{16}/cm^3$ was found by capacitance-voltage measurement (C-V measurement) performed later.

Here, stacking faults (SFs) of the surface of the epitaxial growth layer of each of wafers W82 and W83 were made noticeable by 500° C. molten KOH etching; consequently, it was found that the density of SFs of each epitaxial growth layer was 244 to 883/cm².

Next, the surface of the epitaxial growth layer on each of wafers W82 and W83 was subjected to CMP treatment, and the arithmetic average roughness (Ra) of the surface was reduced from 1 nm to 0.2 nm.

Next, the surface of the epitaxial growth layer of each of wafers W82 and W83 was provided with a vulnerable layer (corresponding to the ion implantation region $5_{ion}$ of FIG. 6(c)). That is, the surface of the epitaxial growth layer of each of wafers W82 and W83 was implanted with hydrogen ions to form the ion implantation region $5_{ion}$ shown in FIG. 6(c). The dose amount of hydrogen ions ($H^+$) implanted was set to $1.0×10^{17}$ atoms/cm², and the ion acceleration energy was set to 65 keV so that the depth of the vulnerable layer might be 400 nm.

Then, wafers W81, W82, and W83 were simultaneously cleaned with a mixed acid of hydrogen peroxide water and sulfuric acid under the same treatment conditions (SPM cleaning), and then the oxide film of the surface was removed by dilute hydrofluoric acid treatment (HF treatment). Next, heat treatment at 700° C. was performed in a hydrogen atmosphere for 10 minutes to terminate the surface of the substrate with hydrogen, and the polarities of the substrates were equalized.

Next, a surface of each of wafers W82 and W83 was brought into contact with and bonded to a surface of wafer W81 (corresponding to the processing shown in FIG. 6(d)). Here, each surface of the wafer before contacting was irradiated with Ar plasma under the same treatment conditions, and was activated. Further, similarly to Example 1, affixing was performed while, using an L-shaped quartz jig, the orientation of the orientation flat of each of wafers W82 and W83 was made to coincide with the orientation of the orientation flat of wafer W81 (that is, in such a manner that the positions of the first orientation flats and the positions of the second orientation flats of the wafers coincided with each other accurately), and the deviation of the crystal plane in the [110] orientation was made less than or equal to 20 arcsec.

Thereby, the densities of mismatched interfaces between wafers W81 and W82 and between wafers W81 and W83 are reduced to a negligible level.

Here, attention is focused on the difference between the wafer W81/W82 interface and the wafer W81/W83 interface. At the interface between wafer W81 and wafer W82, C polar faces face each other, and therefore C—C bonds exist. That is, a unipolar antiphase boundary (APB) of a monomolecular layer exists. On the other hand, at the interface between wafer W81 and wafer W83, a Si polar face of wafer W83 faces a C polar face of wafer W81. Hence, the interface is formed of Si—C bonds, and an APB does not exist at the interface.

Next, each of the bonded body of wafers W81 and W82 and the bonded body of wafers W81 and W83 was heated to 800° C. to cause breaking at the vulnerable layer formed by hydrogen ion implantation, and only a thin film layer with a thickness of 400 nm was allowed to remain (transferred) on the surface of wafer W81 (corresponding to the processing shown in FIG. 6(e)). The wafer in which a thin film layer on the wafer W82 side was transferred to the surface of wafer W81 by breaking is referred to as W812, and the wafer in which a thin film layer on the wafer W83 side was transferred to the surface of wafer W81 is referred to as W813. The arithmetic average roughness Ra of the surface of each of wafers W812 and W813 was increased to more than 1 nm due to the breaking processing, and thus CMP treatment was performed to reduce the arithmetic average roughness Ra of the surface to less than or equal to 0.2 nm.

Next, another round of homoepitaxial growth was performed on the surface of each of wafers W812 and W813.

Prior to homoepitaxial growth, wafers W812 and W813 were separately placed in an epitaxial growth apparatus, then hydrogen at 500 sccm was introduced, and the temperature was increased to 1,350° C. under a pressure of 1 Pa. Upon a lapse of 10 minutes after the temperature reached 1,350° C., which lapse was in order to equalize the temperature in the epitaxial growth apparatus, $SiH_2Cl_2$ gas and $C_2H_2$ gas were additionally introduced and epitaxial growth was started. At this time, the rates of flow of $SiH_2Cl_2$ gas and $C_2H_2$ gas for wafer W812 were set to 50 sccm and 12 sccm, respectively, and the rates of flow of $SiH_2Cl_2$ gas and $C_2H_2$ gas for wafer W813 were set to 50 sccm and 14 sccm, respectively. Treatment for 21 minutes under these conditions was continued to perform homoepitaxial growth of 10 μm. The fact that the homoepitaxial growth layer exhibited electrical conductivity of an n-type and the concentration of remaining carriers was $2\times10^{16}/cm^3$ was found by C-V measurement performed later.

Next, in order to measure the density of defects of the surface of the epitaxial growth layer formed on each of wafers W812 and W813, potassium hydroxide was mounted on the surface and was melted by heating at 500° C. for 5 minutes, and thereby the etching of defects was promoted and noticeable-making treatment was performed. As a result of the measurement by molten KOH etching, it was found that the density of SFs of the surface of wafer W812 was limited within 277 to 1,000/cm², which is substantially equal to that before epitaxial growth, but the density of SFs of the surface of wafer W813 was increased to 11,000 to 34,000/cm². That is, it is presumed that, in wafer W812, the propagation of SFs was obstructed by a unipolar APB of the interface; on the other hand, in wafer W813, since an APB did not exist, SFs of the surface of wafer W81 reached the surface of the epitaxial growth layer.

Table 1 collectively shows the results of the densities of defects of the surfaces of the epitaxial growth layers in the laminated substrates of Examples 3 to 8. The density of defects of each of Examples 3 and 4 (4H-SiC) and Examples 5 and 6 (6H-SiC) is the density of BPDs, and the density of defects of each of Examples 7 and 8 (3C-SiC) is the density of SFs.

As shown in Table 1, in spite of difference in crystal structure (crystal system or crystal arrangement) between the compound semiconductor substrates, the effect of defect propagation suppression by a unipolar APB is obtained in the laminated substrates of the present invention.

TABLE 1

| | Compound semiconductor laminated substrate | | | |
|---|---|---|---|---|
| | Crystal polymorphism (crystal structure) | Polarity of bonded surfaces | | Density of defects of homoepitaxial growth layer (cm$^{-2}$) |
| | | Support substrate | Transfer substrate | Unipolar APB | |
| Example 3 | 4H—SiC | Si | Si | Present | 87 to 375 |
| | | Si | C | Absent | 8,700 to 15,000 |
| Example 4 | 4H—SiC | C | C | Present | 84 to 184 |
| | | C | Si | Absent | 9,200 to 15,000 |
| Example 5 | 6H—SiC | Si | Si | Present | 42 to 292 |
| | | Si | C | Absent | 1,400 to 18,000 |
| Example 6 | 6H—SiC | C | C | Present | 31 to 94 |
| | | C | Si | Absent | 312 to 824 |
| Example 7 | 3C—SiC | Si | Si | Present | 456 to 917 |
| | | Si | C | Absent | 16,000 to 23,000 |
| Example 8 | 3C—SiC | C | C | Present | 277 to 1,000 |
| | | C | Si | Absent | 11,000 to 34,000 |

Hereinabove, the present invention is described by using embodiments; however, the present invention is not limited to these embodiments, and may be altered by other embodiments, additions, alterations, deletions, etc. to the extent that they can be arrived at by one skilled in the art; such alterations etc. are included in the scope of the present invention in any aspect as long as the action and effect of the present invention are exhibited.

For example, although in the present Examples a gas phase growth method in which a ($SiH_4+C_3H_8+H_2$) or ($SiH_2Cl_2+C_2H_2+H_2$) system is used as a mixed gas is used for homoepitaxial growth on the substrate, the effect of the present invention is exhibited regardless of the method of epitaxial growth or the source material, and a similar effect is obtained also when molecular beam epitaxy or solution growth is used, for example.

REFERENCE SIGNS LIST

1 original plate (single-crystalline compound semiconductor original plate)
1a, 1b, 2a, 2b, 3a, 3b, 4a, 4a", 4b, 5a, 5b, 90 compound semiconductor substrate 1*ab*, 2*ab*, 3*ab*, 4*ab*, 5*eb* unipolar antiphase boundary
1$_{cp1}$, 1$_{cp2}$ polar face
3$_{of}$ orientation flat (OF)
3$_n$ notch
4*a'*, 5*e'* compound semiconductor thin film
4$_{ion}$, 5$_{ion}$ ion implantation region
5*c* buffer layer
5*e* homoepitaxial growth layer
10, 20, 30, 40, 50 compound semiconductor laminated substrate
20*f* front surface
20*r* back surface

The invention claimed is:

1. A compound semiconductor laminated substrate comprising:
   two single-crystalline compound semiconductor substrates each containing A and B as constituent elements and both having the same composition and the same atomic arrangement, which substrates are directly bonded together and laminated,
   wherein the crystal orientation of the bonded two single-crystalline compound semiconductor substrates are aligned,
   a front surface and a back surface of the laminated substrate are polar faces made of atoms of the same kind of A or B,
   and a laminated interface is a unipolar antiphase boundary having bonds of either atoms of B bonded to each other or atoms of A bonded to each other, and at the laminated interface, the two single-crystalline compound semiconductors in the laminated substrate having coherent crystal lattices.

2. The compound semiconductor laminated substrate according to claim 1, which is made of silicon carbide, gallium nitride, gallium arsenic, gallium phosphorus, indium phosphorus, aluminum nitride, or indium antimony.

3. The compound semiconductor laminated substrate according to claim 1, wherein each of the laminated compound semiconductor substrates has a uniform thickness.

4. The compound semiconductor laminated substrate according to claim 1, wherein one of the two compound semiconductor substrates is a thin film of a compound semiconductor.

5. The compound semiconductor laminated substrate according to claim 4, wherein one of the two compound semiconductor substrates is an epitaxial film.

6. A power semiconductor device comprising the compound semiconductor laminated substrate according to claim 1.

7. The compound semiconductor laminated substrate according to claim 1, wherein the crystal lattice of one of the two single-crystalline compound semiconductor substrates and the crystal lattice of the other substrate are continuously connected together of the entire laminated interface.

8. The compound semiconductor laminated substrate according to claim 1, wherein the laminated interface has only bonds of atoms of the same kind of element.

9. The compound semiconductor laminated substrate according to claim 1, wherein the laminated interface essentially consists of the unipolar antiphase boundary having either one of anion-anion bonds or cation-cation bonds.

10. The compound semiconductor laminated substrate according to claim 1, wherein the laminated interface inhibits the motion of dislocations.

11. The compound semiconductor laminated substrate according to claim 1, wherein the unipolar antiphase boundary does not make a semi-metallic behavior.

12. The compound semiconductor laminated substrate according to claim 1, wherein the tolerance between the crystal orientations of the bonded two single-crystalline compound semiconductor substrates is less than or equal to 50 arcsec.

13. The compound semiconductor laminated substrate according to claim 1, wherein the laminated interface is the unipolar antiphase boundary that is parallel to the front and back surfaces of the laminated substrate.

14. The compound semiconductor laminated substrate according to claim 1, wherein the density of incoherent interfaces is less than or equal to 0.1% of the density of atoms constituting the interface at the entire laminated interface.

15. The compound semiconductor laminated substrate according to claim 1, wherein the thickness of each of the two single-crystalline compound semiconductor substrates is in the range of 100 nm to 1,000 μm.

16. The compound semiconductor laminated substrate according to claim 1, further comprising a homoepitaxial layer on at least either of the front and back surfaces of the laminated substrate.

* * * * *